(12) United States Patent
Kwon et al.

(10) Patent No.: US 9,293,461 B2
(45) Date of Patent: Mar. 22, 2016

(54) REPLACEMENT METAL GATE STRUCTURES FOR EFFECTIVE WORK FUNCTION CONTROL

(71) Applicant: GLOBALFOUNDRIES INC., Grand Cayman (KY)

(72) Inventors: Unoh Kwon, Fishkill, NY (US); Michael P. Chudzik, Danbury, CT (US); Ravikumar Ramachandran, Pleasantville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 219 days.

(21) Appl. No.: 13/780,003

(22) Filed: Feb. 28, 2013

(65) Prior Publication Data

US 2013/0175635 A1 Jul. 11, 2013

Related U.S. Application Data

(62) Division of application No. 12/885,592, filed on Sep. 20, 2010, now Pat. No. 8,629,014.

(51) Int. Cl.
*H01L 27/092* (2006.01)
*H01L 21/8238* (2006.01)

(52) U.S. Cl.
CPC .... *H01L 27/0922* (2013.01); *H01L 21/823842* (2013.01)

(58) Field of Classification Search
USPC .................... 257/69, 407, E27.062, E27.064, 257/E27.108, E21.632; 438/153, 154, 199, 438/212, 283, FOR. 168, FOR. 187, 438/FOR. 216
See application file for complete search history.

(56) References Cited

U.S. PATENT DOCUMENTS

| 6,033,963 | A | 3/2000 | Huang et al. |
| 7,217,611 | B2 | 5/2007 | Kavalieros et al. |
| 2005/0287746 | A1 | 12/2005 | Metz et al. |
| 2006/0121678 | A1* | 6/2006 | Brask et al. ................... 438/287 |
| 2009/0230479 | A1* | 9/2009 | Hsu et al. ...................... 257/369 |
| 2010/0052066 | A1* | 3/2010 | Yu et al. ......................... 257/369 |

OTHER PUBLICATIONS

U.S. Office Action dated Jun. 20, 2013 issued in U.S. Appl. No. 12/885,592.

* cited by examiner

*Primary Examiner* — Lynne Gurley
*Assistant Examiner* — Vernon P Webb
(74) *Attorney, Agent, or Firm* — Scully, Scott, Murphy & Presser, P.C.

(57) ABSTRACT

A stack of a barrier metal layer and a first-type work function metal layer is deposited in replacement metal gate schemes. The barrier metal layer can be deposited directly on the gate dielectric layer. The first-type work function metal layer is patterned to be present only in regions of a first type field effect transistor. A second-type work function metal layer is deposited directly on the barrier metal layer in the regions of a second type field effect transistor. Alternately, the first-type work function layer can be deposited directly on the gate dielectric layer. The barrier metal layer is patterned to be present only in regions of a first type field effect transistor. A second-type work function metal layer is deposited directly on the gate dielectric layer in the regions of the second type field effect transistor. A conductive material fill and planarization form dual work function replacement gate structures.

9 Claims, 16 Drawing Sheets

REPLACEMENT METAL GATE STRUCTURES FOR EFFECTIVE WORK FUNCTION CONTROL

CROSS REFERENCE TO RELATED APPLICATION

This application is a divisional of U.S. patent application Ser. No. 12/885,592, filed Sep. 20, 2010 the entire content and disclosure of which is incorporated herein by reference.

BACKGROUND

The present disclosure generally relates to semiconductor devices, and particularly to semiconductor structures having dual work function metal gates and a high-k gate dielectric, and methods of manufacturing the same.

High gate leakage current of silicon oxide and nitrided silicon dioxide as well as depletion effect of polysilicon gate electrodes limits the performance of conventional semiconductor oxide based gate electrodes. High performance devices for an equivalent oxide thickness (EOT) less than 1 nm require high dielectric constant (high-k) gate dielectrics and metal gate electrodes to limit the gate leakage current and provide high on-currents. Materials for high-k gate dielectrics include $ZrO_2$, $HfO_2$, other dielectric metal oxides, alloys thereof, and their silicate alloys.

In general, dual metal gate complementary metal oxide semiconductor (CMOS) integration schemes employ two gate materials, one having a work function near the valence band edge of the semiconductor material in the channel and the other having a work function near the conduction band edge of the same semiconductor material. In CMOS devices having a silicon channel, a conductive material having a work function of 4.0 eV is necessary for n-type metal oxide semiconductor field effect transistors (NMOSFETs, or "NFETs") and another conductive material having a work function of 5.0 eV is necessary for p-type metal oxide semiconductor field effect transistors (PMOSFETs, or "PFETs"). In conventional CMOS devices employing polysilicon gate materials, a heavily p-doped polysilicon gate and a heavily n-doped polysilicon gate are employed to address the needs. In CMOS devices employing high-k gate dielectric materials, two types of gate stacks comprising suitable materials satisfying the work function requirements are needed for the PFETs and for the NFETS, in which the gate stack for the PFETs provides a flat band voltage closer to the valence band edge of the material of the channel of the PFETs, and the gate stack for the NFETs provides a flat band voltage closer to the conduction band edge of the material of the channel of the NFETs. In other words, threshold voltages need to be optimized differently between the PFETs and the NFETs.

Manufacture of dual metal gate CMOS structures is difficult because two types of metal gate electrodes are needed to provide different work functions. Integration of dual gate CMOS structures with a replacement gate structure is even more difficult because of the difficulty in patterning different metal layers in replacement gate geometries.

BRIEF SUMMARY

A stack of a barrier metal layer and a first-type work function metal layer having a first-type work function is deposited on a gate dielectric layer within recessed gate cavities after removal of disposable gate structures. In one embodiment, the barrier metal layer is deposited directly on the gate dielectric layer. The first-type work function metal layer is patterned to be present in regions of a first type field effect transistor, which can be p-type or n-type transistors, while removed in regions of a second type field effect transistor. A second-type work function metal layer is deposited directly on the barrier metal layer in the regions of the second type field effect transistor. In another embodiment, the first-type work function layer is deposited directly on the gate dielectric layer. The barrier metal layer is patterned to be present in regions of a first type field effect transistor, while removed in regions of a second type field effect transistor. A second-type work function metal layer is deposited directly on the gate dielectric layer in the regions of the second type field effect transistor. In both embodiments, a conductive material fills the gate cavities, and a subsequent planarization process forms dual work function metal gate structures.

According to an aspect of the present disclosure, a semiconductor structure includes a first field effect transistor and a second field effect transistor that are located on a semiconductor substrate including a semiconductor material. The first field effect transistor includes: a first gate dielectric located over a first portion of the semiconductor substrate; a first barrier metal portion contacting the first gate dielectric; a first-type work function metal portion including a first metal having a first work function and contacting the first barrier metal portion; and a first second-type work function metal portion including a second metal having a second work function and contacting the first-type work function metal portion. One of the first and second work functions is closer to a conduction band of the semiconductor material than a valence band of the semiconductor material, and the other of the first and second work functions is closer to the valence band than to the conduction band. The second field effect transistor includes: a second gate dielectric located over a second portion of the semiconductor substrate; a second barrier metal portion contacting the second gate dielectric; and a second second-type work function metal portion including the second metal and contacting the second barrier metal portion.

According to another aspect of the present disclosure, another semiconductor structure includes a first field effect transistor and a second field effect transistor that are located on a semiconductor substrate including a semiconductor material. The first field effect transistor includes: a first gate dielectric located over a first portion of the semiconductor substrate; a first-type work function metal portion including a first metal having a first work function and contacting the first gate dielectric; a barrier metal portion contacting the first-type work function metal portion; and a first second-type work function metal portion including a second metal having a second work function and contacting the barrier metal portion. One of the first and second work functions is closer to a conduction band of the semiconductor material than a valence band of the semiconductor material, and the other of the first and second work functions is closer to the valence band than to the conduction band. The second field effect transistor includes: a second gate dielectric located over a second portion of the semiconductor substrate; and a second second-type work function metal portion including the second metal and contacting the second barrier metal portion.

According to yet another aspect of the present disclosure, a method of forming a semiconductor structure including a first field effect transistor and a second field effect transistor is provided. The method includes: recessing disposable gate structures below a planar dielectric surface to form gate cavities over a semiconductor substrate; forming a stack, from bottom to top, of a contiguous gate dielectric layer, a barrier metal layer, and a first-type work function metal layer including a first metal having a first work function in the gate cavities and on the planar dielectric surface; patterning the first-type work function metal layer, wherein the first-type work function metal layer is present in a first gate cavity, and the barrier metal layer is exposed in a second gate cavity after the patterning; and forming a second-type work function metal layer including a second metal having a second work function on the first-type work function metal portion and the exposed barrier metal layer. One of the first and second work functions is closer to a conduction band of the semiconductor material than a valence band of the semiconductor material, and the other of the first and second work functions is closer to the valence band than to the conduction band.

According to still another aspect of the present disclosure, another method of forming a semiconductor structure including a first field effect transistor and a second field effect transistor is provided. The method includes: recessing disposable gate structures below a planar dielectric surface to form gate cavities over a semiconductor substrate; forming a stack, from bottom to top, of a contiguous gate dielectric layer, a first-type work function metal layer including a first metal having a first work function, and a barrier metal layer in the gate cavities and on the planar dielectric surface; patterning the barrier metal layer and the first-type work function metal layer, wherein the barrier metal layer and the first-type work function metal layer are present in a first gate cavity, and the barrier metal layer and the first-type work function metal layer are removed in a second gate cavity during the patterning; and forming a second-type work function metal layer including a second metal having a second work function on the barrier metal layer in the first gate cavity and a portion of the contiguous gate dielectric layer in the second gate cavity. One of the first and second work functions is closer to a conduction band of the semiconductor material than a valence band of the semiconductor material, and the other of the first and second work functions is closer to the valence band than to the conduction band.

DETAILED DESCRIPTION

Figure 1:
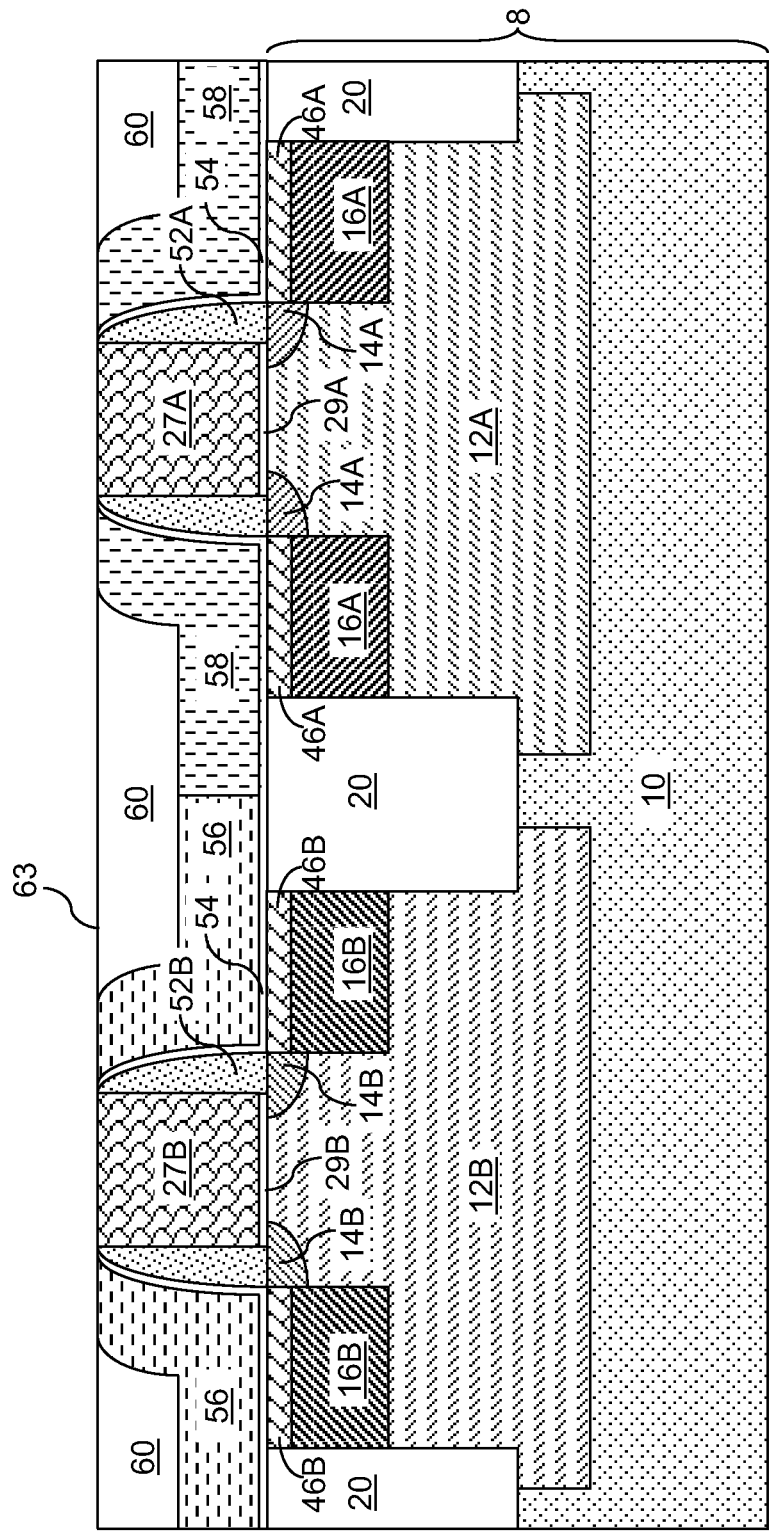
FIG. 1 is a vertical cross-sectional view of a first exemplary semiconductor structure after formation of disposable gate structures and formation of a planar dielectric surface on a planarization dielectric layer according to a first embodiment of the present disclosure.

As stated above, the present disclosure relates to semiconductor structures having dual work function metal gates and a high-k gate dielectric, and methods of manufacturing the same, which are now described in detail with accompanying figures. It is noted that like and corresponding elements mentioned herein and illustrated in the drawings are referred to by like reference numerals. It is also noted that proportions of various elements in the accompanying figures are not drawn to scale to enable clear illustration of elements having smaller dimensions relative to other elements having larger dimensions.

Referring to FIG. 1, a first exemplary semiconductor structure according to a first embodiment of the present disclosure includes a semiconductor substrate 8, on which various components of field effect transistors are formed. The semiconductor substrate 8 can be a bulk substrate including a bulk semiconductor material throughout, or a semiconductor-oninsulator (SOI) substrate (not shown) containing a top semiconductor layer, a buried insulator layer located under the top semiconductor layer, and a bottom semiconductor layer located under the buried insulator layer. The semiconductor material of the semiconductor substrate 8 may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. Typically, the semiconductor material includes silicon.

Various portions of the semiconductor material in the semiconductor substrate 8 can be doped with electrical dopants of p-type or n-type at different dopant concentration levels. For example, the semiconductor substrate 8 may include an underlying semiconductor layer 10, a first conductivity type well 12B, and a second-conductivity type well 12A. The first conductivity type well 12B is doped with electrical dopants of a first conductivity type, which can be p-type or n-type. The second conductivity type well 12A is doped with electrical dopants of a second conductivity type, which is the opposite type of the first conductivity type. For example, if the first conductivity type is p-type, the second conductivity type is n-type, and vice versa.

The dopant concentration of the first conductivity type well 12B and the second conductivity type well 12A can be from $1.0 \times 10^{14}/cm^3$ to $1.0 \times 10^{19}/cm^3$, and typically from $1.0 \times 10^{16}/cm^3$ to $1.0 \times 10^{19}/cm^3$, although lesser and greater concentrations can also be employed. The dopant concentration of the underlying semiconductor layer 10 can be from $1.0 \times 10^{14}/cm^3$ to $1.0 \times 10^{19}/cm^3$, and typically from $1.0 \times 10^{15}/cm^3$ to $1.0 \times 10^{16}/cm^3$, although lesser and greater concentrations can also be employed.

Shallow trench isolation structures 20 are formed to laterally separate each of the first conductivity type well 12B and the second conductivity type well 12A. Typically, each of the first conductivity type well 12B and the second conductivity type well 12A is laterally surrounded by a contiguous portion of the shallow trench isolation structures 20. If the semiconductor substrate 8 is a semiconductor-on-insulator substrate, bottom surfaces of the first conductivity type well 12B and the second conductivity type well 12A may contact a buried insulator layer (not shown), which electrically isolates each of the first conductivity type well 12B and the second conductivity type well 12A from other semiconductor portions of the semiconductor substrate 8 in conjunction with the shallow trench isolation structures 20.

A disposable dielectric layer and a disposable gate material layer are deposited and lithographically patterned to form disposable gate structures. For example, the disposable gate stacks may include a first disposable gate structure that is a stack of a first disposable dielectric portion 29A and a first disposable gate material portion 27A and a second disposable gate structure that is a stack of a second disposable dielectric portion 29B and a second disposable gate material portion 27B. The disposable dielectric layer includes a dielectric material such as a semiconductor oxide. The disposable gate material layer includes a material that can be subsequently removed selective to dielectric material such as a semiconductor material. The first disposable gate structure (29A, 27A) is formed over the second conductivity type well 12A, and the second disposable gate structure (29B, 27B) is formed over the first conductivity type well 12B. The height of the first disposable gate structure (29A, 27A) and the second disposable gate structure (29B, 27B) can be from 20 nm to 500 nm, and typically from 40 nm to 250 nm, although lesser and greater heights can also be employed.

Dopants of the first conductivity type are implanted into portions of the second conductivity type well 12A that are not covered by the first disposable gate structure (29A, 27A) to form first source and drain extension regions 14A. The first conductivity type well 12B can be masked by a photoresist (not shown) during the implantation of the first conductivity type dopants to prevent implantation of the first conductivity type dopants therein. The dopant concentration in the first source and drain extension regions 14A can be from $1.0 \times 10^{18}/cm^3$ to $1.0 \times 10^{21}/cm^3$, and typically from $1.0 \times 10^{19}/cm^3$ to $3.0 \times 10^{20}/cm^3$, although lesser and greater concentrations can also be employed. Similarly, dopants of the second conductivity type are implanted into portions of the first conductivity type well 12B that are not covered by the second disposable gate structure (29B, 27B) to form second source and drain extension regions 14B. The second conductivity type well 12A can be masked by a photoresist (not shown) during the implantation of the second conductivity type dopants to prevent implantation of the second conductivity type dopants therein. The dopant concentration in the second source and drain extension regions 14B can be from $1.0 \times 10^{18}/cm^3$ to $1.0 \times 10^{21}/cm^3$, and typically from $1.0 \times 10^{19}/cm^3$ to $3.0 \times 10^{20}/cm^3$, although lesser and greater concentrations can also be employed.

Dielectric gate spacers are formed on sidewalls of each of the disposable gate structures, for example, by deposition of a conformal dielectric material layer and an anisotropic etch. The dielectric gate spacers include a first dielectric gate spacer 52A formed around the first disposable gate structure (29A, 27A) and a second dielectric gate spacer 52B formed around the second disposable gate structure (29B, 27B).

Dopants of the first conductivity type are implanted into portions of the second conductivity type well 12A that are not covered by the first disposable gate structure (29A, 27A) and the first dielectric gate spacer 52A to form first source and drain regions 16A. The first conductivity type well 12B can be masked by a photoresist (not shown) during the implantation of the first conductivity type dopants to prevent implantation of the first conductivity type dopants therein. The dopant concentration in the first source and drain regions 16A can be from $1.0 \times 10^{19}/cm^3$ to $1.0 \times 10^{21}/cm^3$, and typically from $1.0 \times 10^{20}/cm^3$ to $5.0 \times 10^{20}/cm^3$, although lesser and greater concentrations can also be employed. Similarly, dopants of the second conductivity type are implanted into portions of the first conductivity type well 12B that are not covered by the second disposable gate structure (29B, 27B) and the second dielectric gate spacer 52B to form second source and drain regions 16B. The second conductivity type well 12A can be masked by a photoresist (not shown) during the implantation of the second conductivity type dopants to prevent implantation of the second conductivity type dopants therein. The dopant concentration in the second source and drain regions 16B can be from $1.0 \times 10^{19}/cm^3$ to $1.0 \times 10^{21}/cm^3$, and typically from $1.0 \times 10^{20}/cm^3$ to $5.0 \times 10^{20}/cm^3$, although lesser and greater concentrations can also be employed.

In some embodiments, the first source and drain regions 16A and/or the second source and drain regions 16B can be formed by replacement of the semiconductor material in the second conductivity type well 12A and/or the semiconductor material in the first conductivity type well 12B with a new semiconductor material having a different lattice constant. In this case, the new semiconductor material(s) is/are typically epitaxially aligned with (a) single crystalline semiconductor material(s) of the second conductivity type well 12A and/or the semiconductor material in the first conductivity type well 12B, and apply/applies a compressive stress or a tensile stress to the semiconductor material of the second conductivity type well 12A and/or the semiconductor material in the first conductivity type well 12B between the first source and drain extension regions 14A and/or between the second source and drain extension regions 14B.

First metal semiconductor alloy portions 46A and second metal semiconductor alloy portions 46B are formed on exposed semiconductor material on the top surface of the semiconductor substrate 8, for example, by deposition of a metal layer (not shown) and an anneal. Unreacted portions of the metal layer are removed selective to reacted portions of the metal layer. The reacted portions of the metal layer constitute the metal semiconductor alloy portions (46A, 46B), which can include a metal silicide portions if the semiconductor material of the first and second source and drain regions (16A, 16B) include silicon.

Optionally, a dielectric liner 54 may be deposited over the metal semiconductor alloy portions 54, the first and second disposable gate structures (29A, 27A, 29B, 27B), and the first and second dielectric gate spacers (52A, 52B). A first type stress-generating liner 58 and a second type stress-generating liner 56 can be formed over the first disposable gate structure (29A, 27A) and the second disposable gate structure (29B, 27B), respectively. The first type stress-generating liner 58 and/or the second type stress-generating liner 56 can be employed to apply uniaxial or biaxial lateral stress to a first channel region, which is the portion of the second conductivity type well 12A between the first source and drain extension regions 14A, and/or to a second channel region, which is the portion of the first conductivity type well 12B between the second source and drain extension regions 14B, respectively. In one embodiment, one of the first type stress-generating liner 58 and the second type stress-generating liner 56 applies a compressive stress if underlying source and drain regions (i.e., the first source and drain regions 16A or the second source and drain regions 16B) are p-doped regions, and the other of the first type stress-generating liner 58 or the second type stress-generating liner 56 applies a tensile stress if underlying source and drain regions (i.e., the second source and drain regions 16B and the first source and drain regions 16A) are n-doped regions. The first type stress-generating liner 58 and the second type stress-generating liner 56 can include a dielectric material that generates a compressive stress or a tensile stress to underlying structures, and can be silicon nitride layers deposited by plasma enhanced chemical vapor deposition under various plasma conditions.

A planarization dielectric layer 60 is deposited over the first type stress-generating liner 58 and/or the second type stress-generating liner 56, if present, or over the metal semiconductor alloy portions 54, the first and second disposable gate structures (29A, 27A, 29B, 27B), and the first and second dielectric gate spacers (52A, 52B) if (a) stress-generating liner(s) is/are not present. Preferably, the planarization dielectric layer 60 is a dielectric material that may be easily planarized. For example, the planarization dielectric layer 60 can be a doped silicate glass or an undoped silicate glass (silicon oxide).

The planarization dielectric layer 60, the first type stress-generating liner 58 and/or the second type stress-generating liner 56 (if present), and the dielectric liner 54 (if present) are planarized above the topmost surfaces of the first and second disposable gate structures (29A, 27A, 29B, 27B), i.e., above the topmost surfaces of the first and second disposable gate material portions (27A, 27B). The planarization can be performed, for example, by chemical mechanical planarization (CMP). The planar topmost surface of the planarization dielectric layer 60 is herein referred to as a planar dielectric surface 63.

In one embodiment, the first conductivity type is p-type and the second conductivity type is n-type. The first source and drain extension regions 14A and the first source and drain regions 16A are p-doped, and the second conductivity type well 12A is n-doped. The combination of the first source and drain extension regions 14A, the first source and drain regions 16A, and the second conductivity type well 12A can be employed to subsequently form a p-type field effect transistor. Correspondingly, the first source and drain extension regions 14A and the first source and drain regions 16A are n-doped, and the second conductivity type well 12A is p-doped. The combination of the first source and drain extension regions 14A, the first source and drain regions 16A, and the second conductivity type well 12A can be employed to subsequently form an n-type field effect transistor. The first type stress-generating liner 58 can apply a tensile stress to the first channel, and the second type stress-generating liner 56 can apply a compressive stress to the second channel.

In another embodiment, the first conductivity type is n-type and the second conductivity type is p-type. The first source and drain extension regions 14A and the first source and drain regions 16A are n-doped, and the second conductivity type well 12A is p-doped. The combination of the first source and drain extension regions 14A, the first source and drain regions 16A, and the second conductivity type well 12A can be employed to subsequently form an n-type field effect transistor. Correspondingly, the first source and drain extension regions 14A and the first source and drain regions 16A are p-doped, and the second conductivity type well 12A is n-doped. The combination of the first source and drain extension regions 14A, the first source and drain regions 16A, and the second conductivity type well 12A can be employed to subsequently form a p-type field effect transistor. The first type stress-generating liner 58 can apply a compressive stress to the first channel, and the second type stress-generating liner 56 can apply a tensile stress to the second channel.

Figure 2:
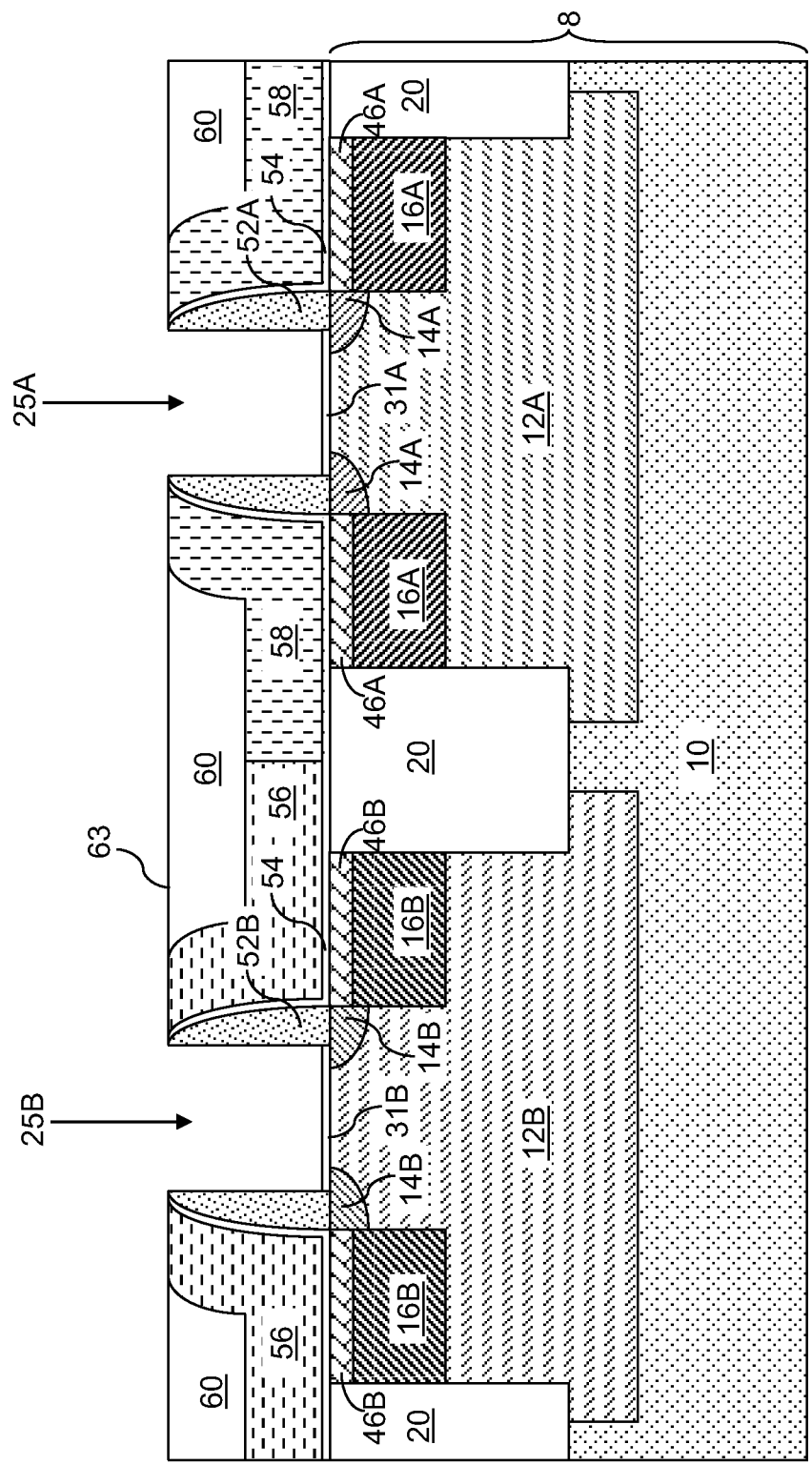
FIG. 2 is a vertical cross-sectional view of the first exemplary semiconductor structure after removal of the disposable gate structures according to the first embodiment of the present disclosure.

Referring to FIG. 2, the first disposable gate structure (29A, 27A) and the second disposable gate structure (29B, 27B) are removed by at least one etch. The at least one etch can be a recess etch, which can be an isotropic etch or anisotropic etch. The etch employed to remove the first and second disposable gate material portions (27A, 27B) is preferably selective to the dielectric materials of the planarization dielectric layer 60, the first type stress-generating liner 58 and/or the second type stress-generating liner 56 (if present), and the first and second dielectric gate spacers (52A, 52B). Optionally, one or both of the dielectric portions (29A, 29B) can be left by etch selective to these layers. The disposable gate structures (29A, 27A, 29B, 27B) are recessed below the planar dielectric surface 63 and to expose the semiconductor surfaces above the first channel and the second channel to form gate cavities (25A, 25B) over the semiconductor substrate.

Optionally, a first semiconductor-element-containing dielectric layer 31A can be formed on the exposed surface of the second conductivity type well 12A by conversion of the exposed semiconductor material into a dielectric material, and a second semiconductor-element-containing dielectric layer 31B can be formed on the exposed surface of the first conductivity type well 12B by conversion of the exposed semiconductor material into the dielectric material. The formation of the semiconductor-element-containing dielectric layers (31A, 31B) can be effected by thermal conversion or plasma treatment. If the semiconductor material of the second conductivity type well 12A and the first conductivity type well 12B includes silicon, the semiconductor-element-containing dielectric layers (31A, 31B) can include silicon oxide or silicon nitride.

Figure 3:
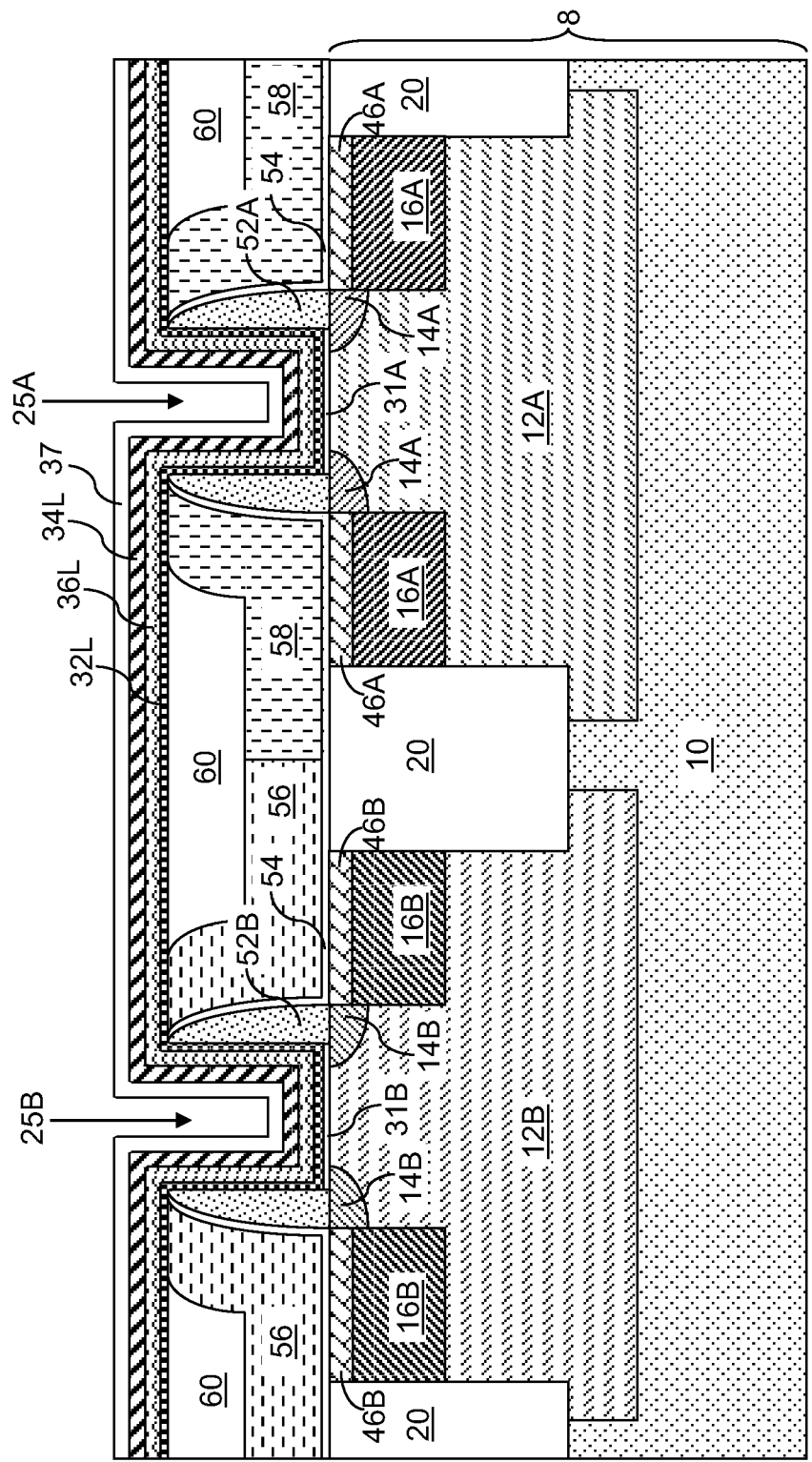
FIG. 3 is a vertical cross-sectional view of the first exemplary semiconductor structure after formation of a stack of a contiguous gate dielectric layer, a barrier metal layer, a first-type work function metal layer, and a dielectric masking layer according to the first embodiment of the present disclosure.

Referring to FIG. 3, a contiguous gate dielectric layer 32L, a barrier metal layer 36L, a first-type work function metal layer 34L, and a dielectric masking layer 37 are sequentially deposited as a stack in the gate cavities (25A, 25B) and on the planar dielectric surface 63. The contiguous gate dielectric layer 32L can be a high dielectric constant (high-k) material layer having a dielectric constant greater than 8.0. The contiguous gate dielectric layer 32L can include a dielectric metal oxide, which is a high-k material containing a metal and oxygen, and is known in the art as high-k gate dielectric materials. Dielectric metal oxides can be deposited by methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), etc. Exemplary high-k dielectric material include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The thickness of the contiguous gate dielectric layer 32L, as measured at horizontal portions, can be from 0.9 nm to 6 nm, and preferably from 1.0 nm to 3 nm. The high-k material layer 32L may have an effective oxide thickness on the order of or less than 1 nm.

The barrier metal layer 36L includes a "metal," which refers to any of an elemental metal, an alloy of elemental metals, a conductive compound of an elemental metal and a non-metal element, and alloys and compounds thereof. The metal of the barrier metal layer 36 is selected to enable a subsequent selective etching of the material of the first-type work function metal layer 34L. As such, the metal of the barrier metal layer 36L and the metal of the first-type work function metal layer 34L are different materials.

The barrier metal layer 36L can be a layer of a mid band gap metal, semiconductor valence band edge metals, or semiconductor conduction band edge metals. A semiconductor valence band edge metal refers to a metal having a Fermi level near or below the valence band edge of the semiconductor material of the second conductivity type well 12A and the first conductivity type well 12B. A semiconductor conduction band edge metal refers to a metal having a Fermi level near or above the conduction band edge of the semiconductor material of the second conductivity type well 12A and the first conductivity type well 12B. Typically, the Fermi level of a metal is considered to be "near" the valence band edge or the conduction band edge if the Fermi level of the metal is within 0.25 eV of the valence band edge or the conduction band edge of a semiconductor material. A mid band gap metal refers to a metal having a Fermi level that is between, and more than 0.25 eV away from, the valence band edge and the conduction band edge of the semiconductor material of the second conductivity type well 12A and the first conductivity type well 12B.

For example, if the semiconductor material of the second conductivity type well 12A and the first conductivity type well 12B is silicon, the barrier metal layer 36L can be a layer of a mid band gap metal such as Ag, Mo, Ta, Re, Hg, Fe, Ru, alloys thereof, and conductive compounds thereof; or semiconductor valence band edge metals such as Pt, Rh, Ir, Ru, Cu, Os, Be, Co, Pd, Te, Cr, Ni, TiN, and alloys thereof; or semiconductor conduction band edge metals such as Hf, Ti, Zr, Cd, La, Tl, Yb, Al, Ce, Eu, Li, Pb, Tb, Bi, In, Lu, Nb, Sm, V, Zr, Ga, Mg, Gd, Y, and TiAl (i.e., an alloy of Ti and Al), and alloys thereof. Conductive compounds can be a conductive metal oxide, a conductive metal nitride, or a conductive metal oxynitride. In one embodiment, the barrier metal layer 36L is a layer of TaN.

The barrier metal layer 36L can be formed, for example, by physical vapor deposition (PVD, i.e., sputtering), chemical vapor deposition, or atomic layer deposition (ALD). The barrier metal layer 36L is thin enough to allow the energy band at the bottom of the barrier metal layer 36L to be affected by the composition of the material of the first-type work function metal layer 34L. In order to ensure that the material of the first-type work function metal layer 34L causes significant band bending at the bottom of the barrier metal layer 36L, the thickness of the barrier metal layer 36L is typically set at a value from 0.5 nm to 5 nm, and more typically, from 1 nm to 3 nm.

The first-type work function metal layer 34L includes a first metal, which has a first work function. The material of the first-type work function metal layer 34L is different from the material of the barrier metal layer 36L, and is selected to be a metal that can be etched selective to the metal of the barrier metal layer 36L. The first metal of the first-type work function metal layer 34L is selected to optimize the performance of a transistor to be subsequently formed employing the first source and drain extension regions 14A, the first source and drain regions 16A, and the second conductivity type well 12A.

In one embodiment, the first conductivity type is p-type and the semiconductor material of the second conductivity type well 12A includes n-doped silicon, and the first-type work function metal layer 34L includes a silicon valence band edge metals such as Pt, Rh, Ir, Ru, Cu, Os, Be, Co, Pd, Te, Cr, Ni, TiN, and alloys thereof. For example, the first-type work function metal layer 34L can be a layer of TiN.

In another embodiment, the first conductivity type is n-type and the semiconductor material of the second conductivity type well 12A includes p-doped silicon, and the first-type work function metal layer 34L includes a silicon conduction band edge metals such as Hf, Ti, Zr, Cd, La, Tl, Yb, Al, Ce, Eu, Li, Pb, Tb, Bi, In, Lu, Nb, Sm, V, Zr, Ga, Mg, Gd, Y, and TiAl, and alloys thereof. For example, the first-type work function metal layer 34L can be a layer of TiAl.

The first-type work function metal layer 34L can be formed, for example, by physical vapor deposition, chemical vapor deposition, or atomic layer deposition (ALD). The first-type work function metal layer 34L is thick enough to significantly affect the energy band at the bottom of the barrier metal layer 36L. In order to ensure that the material of the first-type work function metal layer 34L causes significant band bending at the bottom of the barrier metal layer 36L, the thickness of the first-type work function metal layer 34L is typically set at a value from 2 nm to 30 nm, and more typically, from 3 nm to 10 nm, although lesser and greater thicknesses can also be employed.

The dielectric masking layer 37 includes a dielectric material such as silicon oxide, silicon nitride, or silicon oxynitride. The dielectric masking layer 37 can be deposited, for example, by chemical vapor deposition, or atomic layer deposition (ALD). The thickness of the dielectric masking layer can be from 1 nm to 30 nm, and typically from 2 nm to 15 nm, although lesser and greater thicknesses can also be employed.

Figure 4:
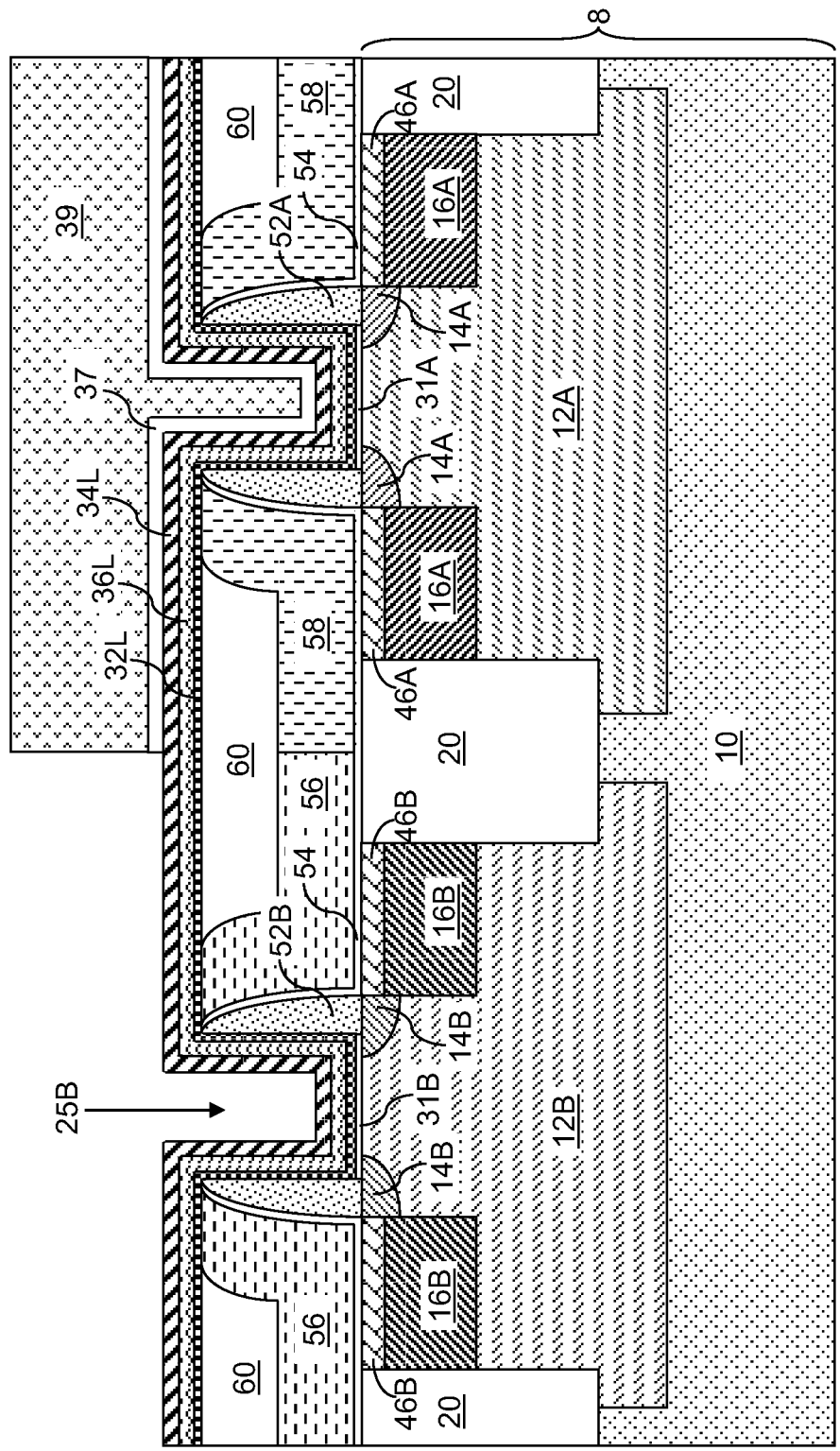
FIG. 4 is a vertical cross-sectional view of the first exemplary semiconductor structure after application of a photoresist and lithographic patterning of the dielectric masking layer according to the first embodiment of the present disclosure.

Referring to FIG. 4, a photoresist 39 is applied over the dielectric masking layer 37 and lithographic patterned so that the photoresist 39 covers the area over the second conductivity type well 12A, while the top surface of the dielectric masking layer 37 is exposed over the first conductivity type well 12B. The pattern in the photoresist 39 is transferred into the dielectric masking layer 37 by an etch, so that the exposed portion of the dielectric masking layer 37 is removed from within the second gate cavity 25B and a surrounding area thereabout.

Figure 5:
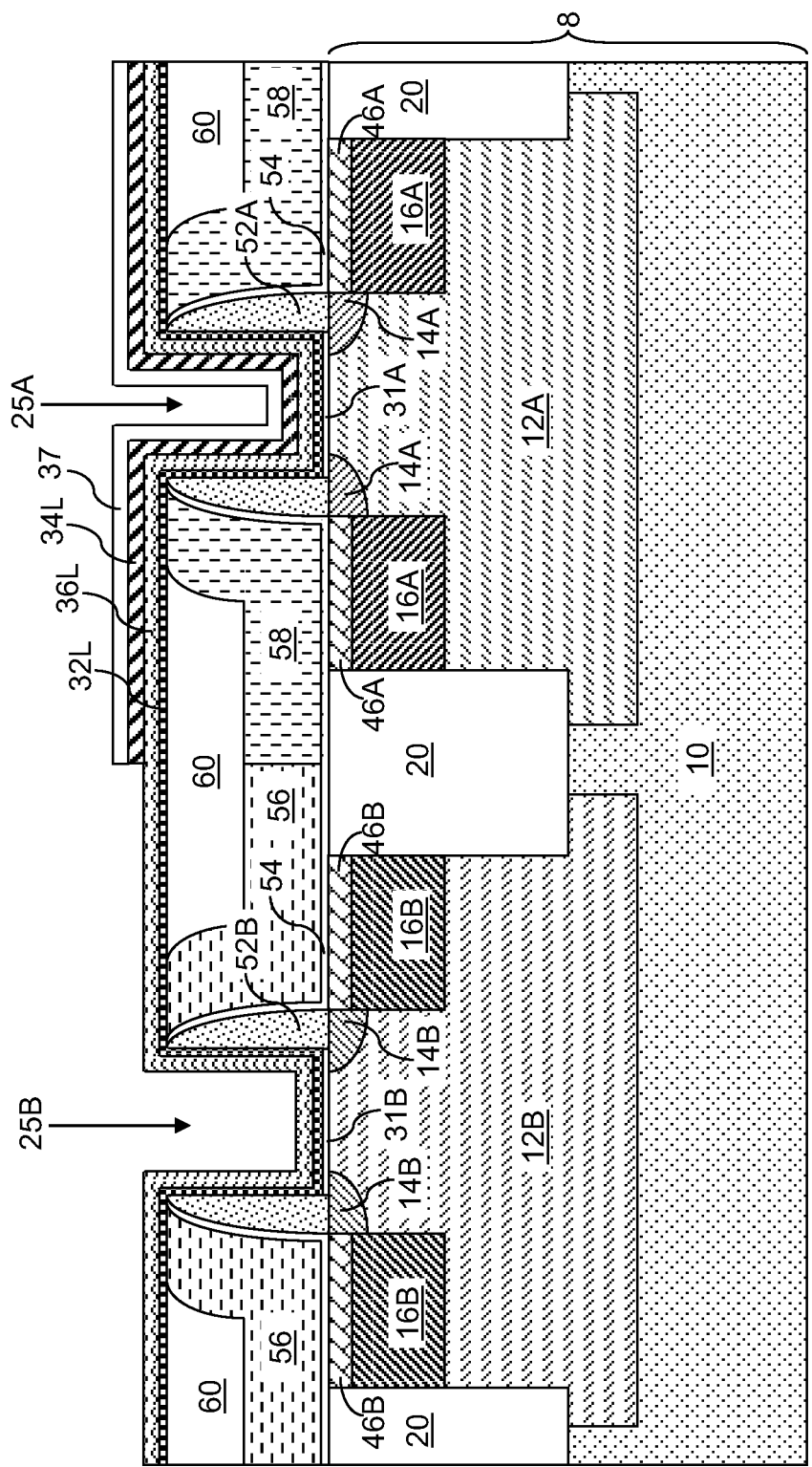
FIG. 5 is a vertical cross-sectional view of the first exemplary semiconductor structure after removal of the photoresist and patterning of the first-type work function metal layer employing the dielectric masking layer as an etch mask according to the first embodiment of the present disclosure.

Referring to FIG. 5, the photoresist 39 is removed, for example, by ashing or wet chemistries. The dielectric masking layer 37 is employed as an etch mask to remove the exposed portion of the first-type work function metal layer 34L from above the first conductivity type well 12B. Specifically, the portion of the first-type work function metal layer 34L is removed from within the second gate cavity 25B employing the remaining portion of the dielectric masking layer 37 as an etch mask during the patterning of the first-type work function metal layer 34L. After the patterning of the first-type work function metal layer 34L, the first-type work function metal layer 34L is present in the first gate cavity 25A, and the barrier metal layer 36L is exposed in the second gate cavity 25B.

Figure 6:
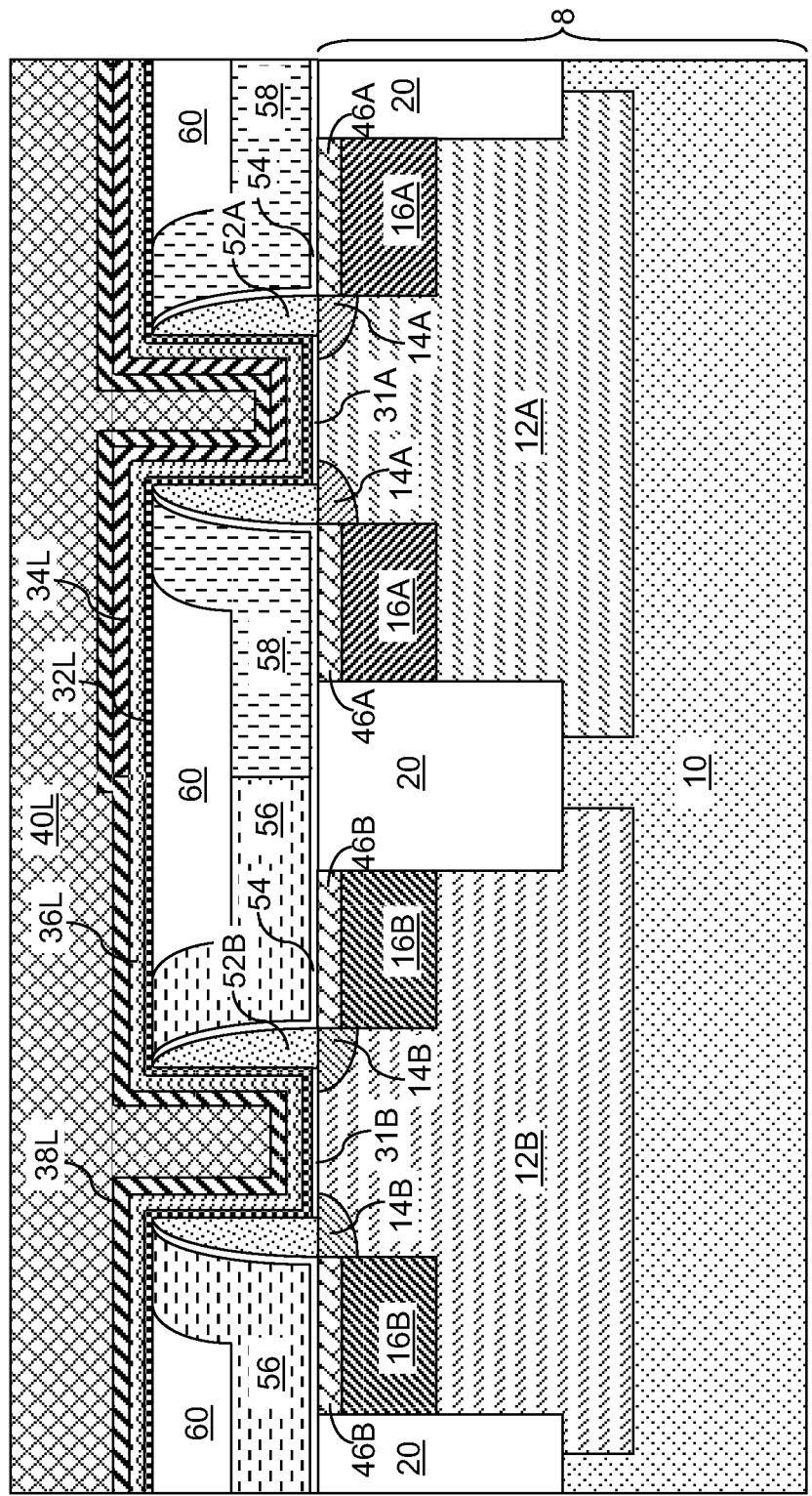
FIG. 6 is a vertical cross-sectional view of the first exemplary semiconductor structure after formation of a second-type work function metal layer and a gate conductor layer according to the first embodiment of the present disclosure.

Referring to FIG. 6, the dielectric masking layer 37 is removed selective to the barrier metal layer 36L and the first-type work function metal layer 34L. A second-type work function metal layer 38L and a gate conductor layer 40L are deposited on the exposed surfaces of the barrier metal layer 36L and the first-type work function metal layer 34L. The second-type work function metal layer 38L includes a second metal having a second work function, which is different from the first work function. The second metal of the second-type work function metal layer 38L is selected to optimize the performance of a transistor to be subsequently formed employing the second source and drain extension regions 14B, the second source and drain regions 16B, and the first conductivity type well 12B.

In one embodiment, the second conductivity type is n-type and the semiconductor material of the first conductivity type well 12B includes p-doped silicon, and the second-type work function metal layer 38L includes a silicon conduction band edge metals such as Hf, Ti, Zr, Cd, La, Tl, Yb, Al, Ce, Eu, Li, Pb, Tb, Bi, In, Lu, Nb, Sm, V, Zr, Ga, Mg, Gd, Y, and TiAl, and alloys thereof. For example, the second-type work function metal layer 38L can be a layer of TiAl.

In another embodiment, the second conductivity type is p-type and the semiconductor material of the first conductivity type well 12B includes n-doped silicon, and the second-type work function metal layer 38L includes a silicon valence band edge metals such as Pt, Rh, Ir, Ru, Cu, Os, Be, Co, Pd, Te, Cr, Ni, TiN, and alloys thereof. For example, the second-type work function metal layer 38L can be a layer of TiN.

The second-type work function metal layer 38L can be formed, for example, by physical vapor deposition, chemical vapor deposition, or atomic layer deposition (ALD). The second-type work function metal layer 38L is thick enough to significantly affect the energy band at the bottom of the portion of the barrier metal layer 36L that contacts the second-type work function metal layer 38L, i.e., within the second gate cavity 25B. In order to ensure that the material of the second-type work function metal layer 38L causes significant band bending at the bottom of the barrier metal layer 36L, the thickness of the second-type work function metal layer 34L is typically set at a value from 2 nm to 100 nm, and more typically, from 3 nm to 10 nm, although lesser and greater thicknesses can also be employed.

In one embodiment, one of the first and second work functions is closer to the conduction band of the semiconductor material of the first conductivity type well 12B and the second conductivity type well 12A than the valence band of that semiconductor material, and the other of the first and second work functions is closer to the valence band than to the conduction band of that material. Typically, the work function that is closer to the conduction band than to the valence band of the semiconductor material is employed to enhance the performance of an n-type field effect transistor, and the work function that is closer to the valence band than to the conduction band of the semiconductor material is employed to enhance the performance of a p-type field effect transistor.

The gate conductor layer 40L is deposited on the second-type work function metal layer 38L, for example, by chemical vapor deposition, physical vapor deposition, or a combination thereof. The first and second gate cavities (25A, 25B) are completely filled by the gate conductor layer 40L. The gate conductor layer 40L includes a conductive material such as a metal or a doped semiconductor material.

Figure 7:
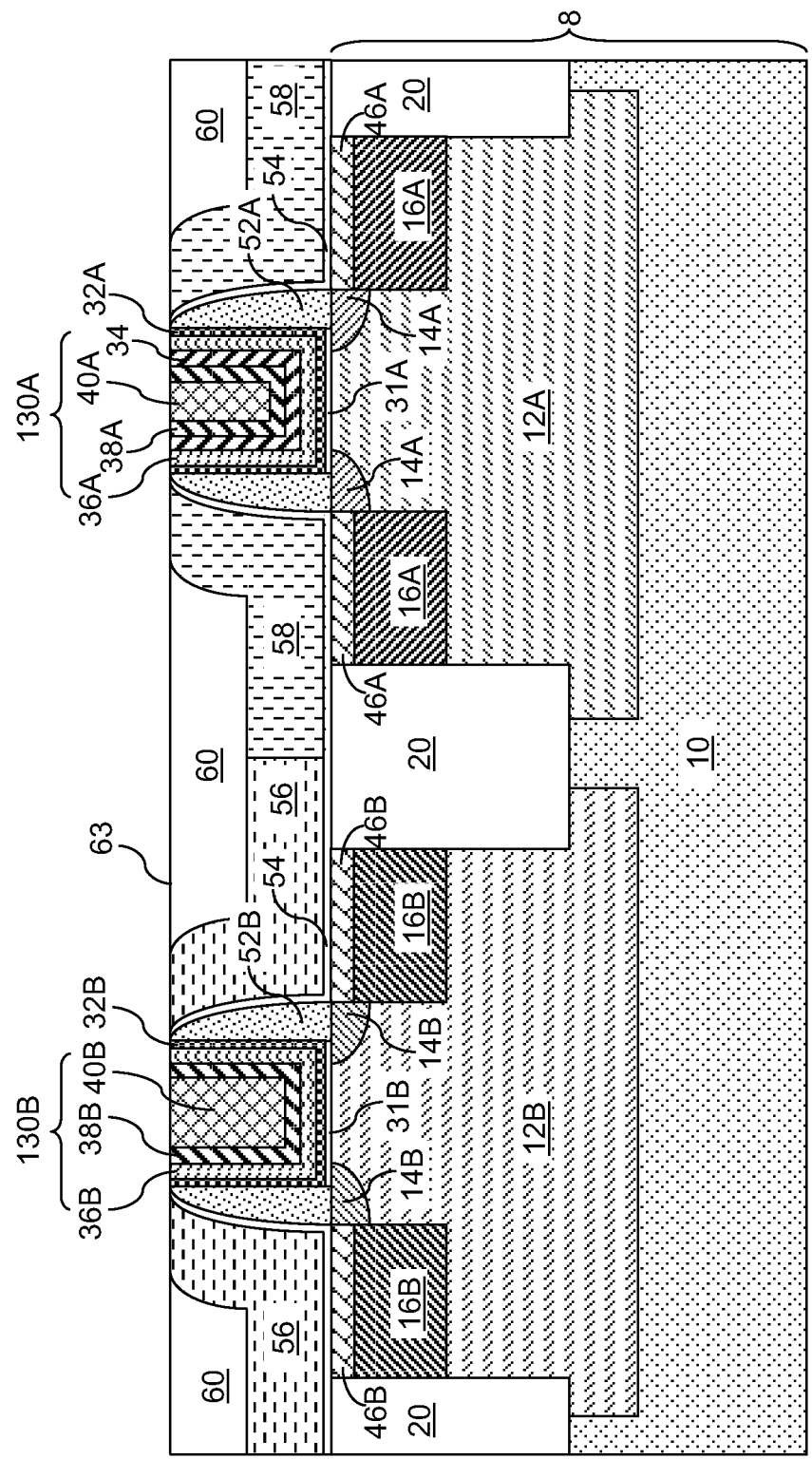
FIG. 7 is a vertical cross-sectional view of the first exemplary semiconductor structure after removal of materials above the planar dielectric surface to form gate structures according to the first embodiment of the present disclosure.

Referring to FIG. 7, portions of the gate conductor layer 40L, the second-type work function metal layer 38L, the first-type work function metal layer 34L, the barrier metal layer 36L, and the portion of the contiguous gate dielectric layer 32L are removed from above the planar dielectric surface 63 of the planarization dielectric layer 63 by employing a planarization process.

A first field effect transistor is formed in the region of the second conductivity type well 12A. The first field effect transistor includes the second conductivity type well 12A, the first source and drain extension regions 14A, the first source and drain regions 16A, a first metal semiconductor alloy portions 46A, the optional first semiconductor-element-containing dielectric layer 31A, a first gate dielectric 32A which is a remaining portion of the contiguous gate dielectric layer 32L, a first barrier metal portion 36A which is a remaining portion of the barrier metal layer 36L, a first-type work function metal portion 34 which is a remaining portion of the first-type work function metal layer 34L, a first second-type work function metal portion 38A which is a remaining portion of the second-type work function metal layer 38L, and a first gate conductor portion 40A which is a remaining portion of the gate conductor layer 40L. The first second-type work function metal portion 38A includes the second metal and contacts the first-type work function metal portion 34 that includes the first metal.

A second field effect transistor is formed in the region of the first conductivity type well 12B. The second field effect transistor includes the first conductivity type well 12B, the second source and drain extension regions 14B, the second source and drain regions 16B, a second metal semiconductor alloy portions 46B, the optional second semiconductor-element-containing dielectric layer 31B, a second gate dielectric 32B which is a remaining portion of the contiguous gate dielectric layer 32L, a second barrier metal portion 36B which is a remaining portion of the barrier metal layer 36L, a second second-type work function metal portion 38B which is a remaining portion of the second-type work function metal layer 38L, and a second gate conductor portion 40B which is a remaining portion of the gate conductor layer 40L. The second second-type work function metal portion 38B includes the second metal and contacts the second barrier metal portion 36B, which has the same thickness as, and includes the same material as, the first barrier metal portion 36A.

Each of the first and second gate dielectrics (32A, 32B) includes a horizontal gate dielectric portion and a vertical gate dielectric portion extending upward from peripheral regions of the horizontal gate dielectric portion. In the first field effect transistor, the first barrier metal portion 36A contacts inner sidewalls of the vertical gate dielectric portion of the first gate dielectric 32A. In the second field effect transistor, the second barrier metal portion 36B contacts inner sidewalls of the vertical gate dielectric portion of the second gate dielectric 32B.

The first gate conductor portion 40A contacts an upper surface and inner sidewalls of the first second-type work function metal portion 38A. The second gate conductor portion 40B contacts an upper surface and inner sidewalls of the second second-type work function metal portion 38B. The first and second barrier metal portions (36A, 36B) include the same metal. The metal of the first and second barrier metal portions (36A, 36B) may, or may not, have a work function that is between the first work function and the second work function.

Figure 8:
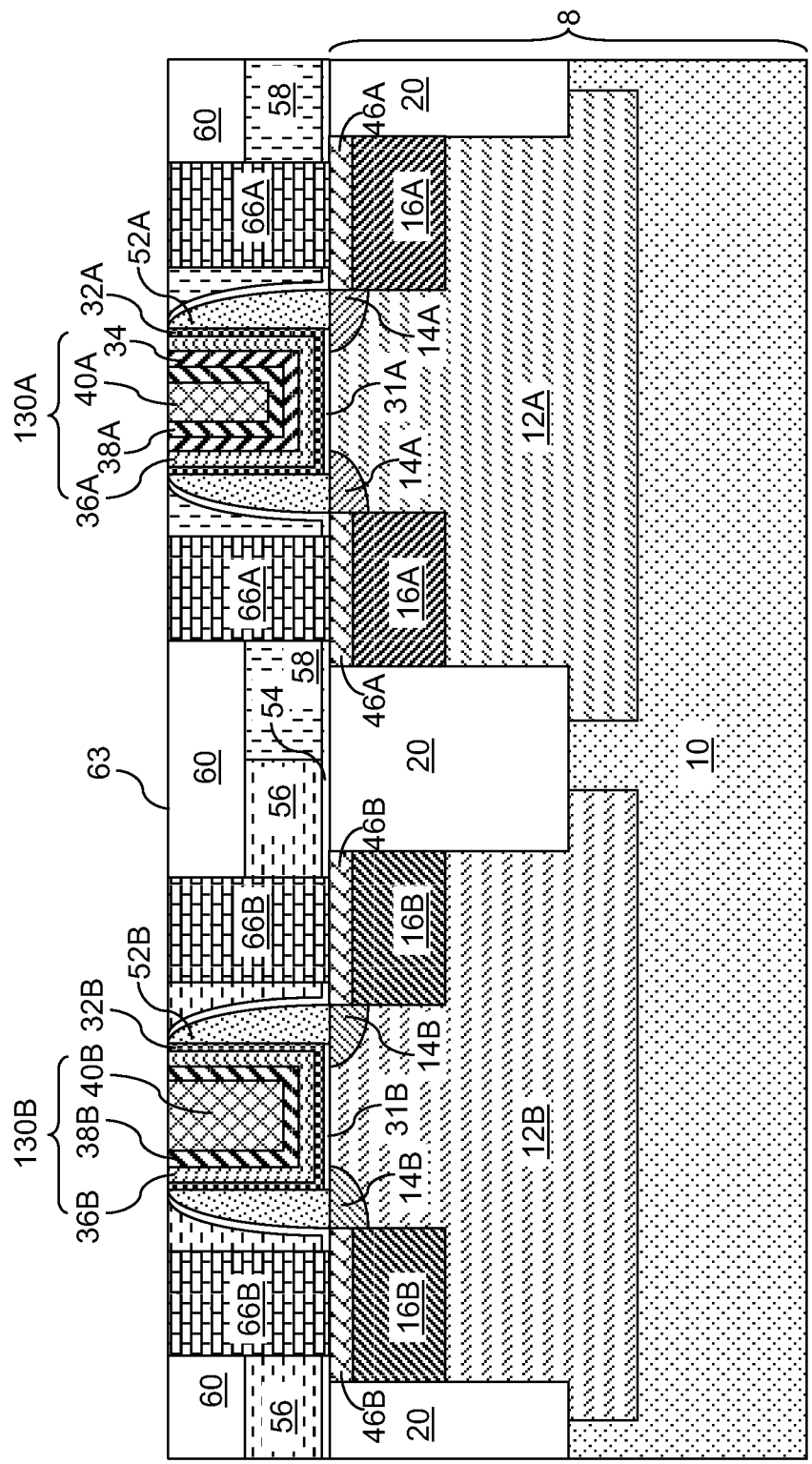
FIG. 8 is a vertical cross-sectional view of the first exemplary semiconductor structure after formation of contact via structures according to the first embodiment of the present disclosure.

Referring to FIG. 8, contact via structures (66A, 66B) can be formed, for example, by formation of contact via cavities by a combination of lithographic patterning and an anisotropic etch followed by deposition of a conductive material and planarization that removes an excess portion of the conductive material from above the planar dielectric surface 63.

Figure 9:
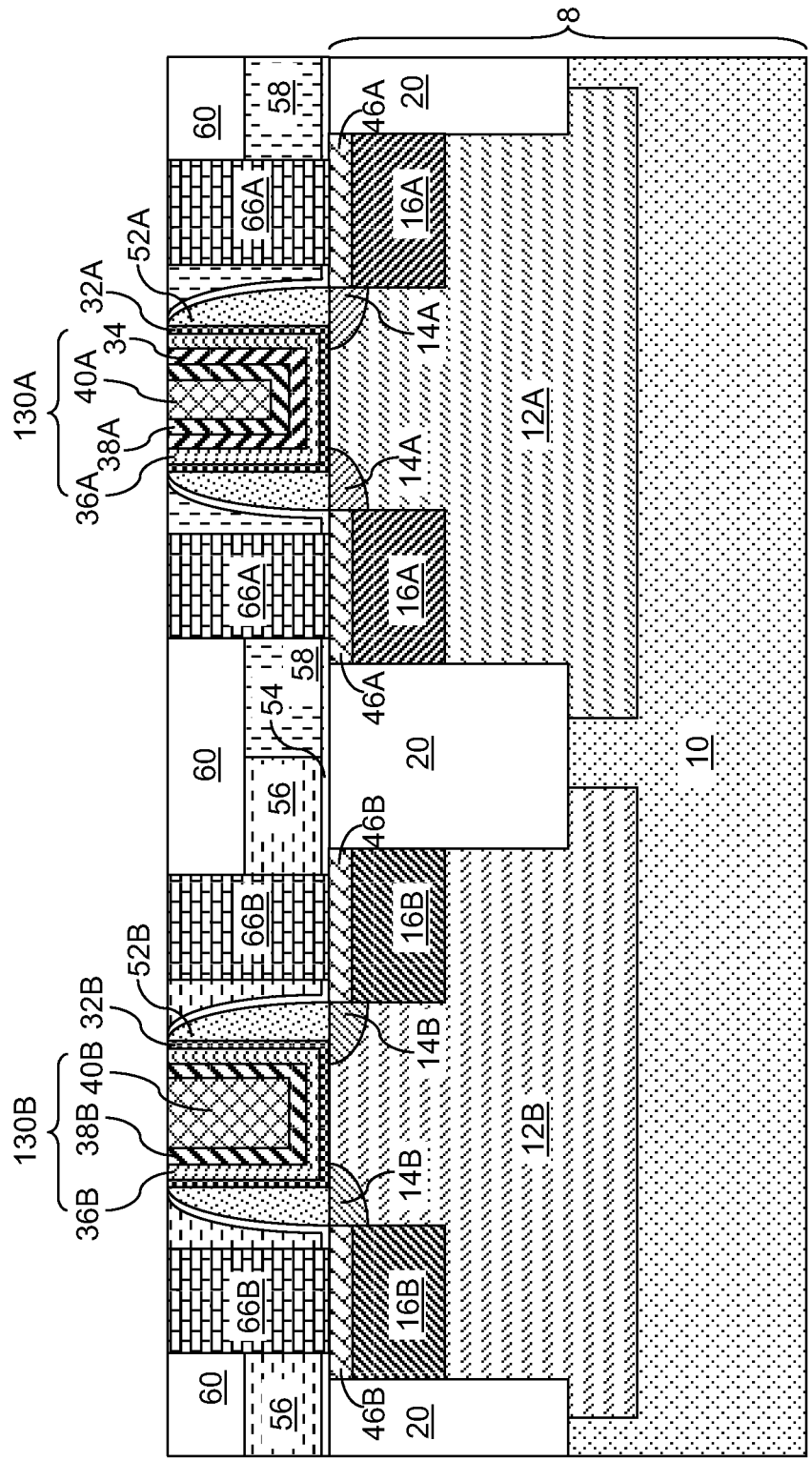
FIG. 9 is a vertical cross-sectional view of a variation of the first exemplary semiconductor structure according to the first embodiment of the present disclosure.

Referring to FIG. 9, a variation of the first exemplary semiconductor structure can be derived from the first exemplary semiconductor structure by omitting the formation of the first semiconductor-element-containing dielectric layer 31A and the second semiconductor-element-containing dielectric layer 31B. In this case, the first gate dielectric 32A contacts the second conductivity type well 12A, and the second gate dielectric 32B contacts the first conductivity type well 12B.

Figure 10:
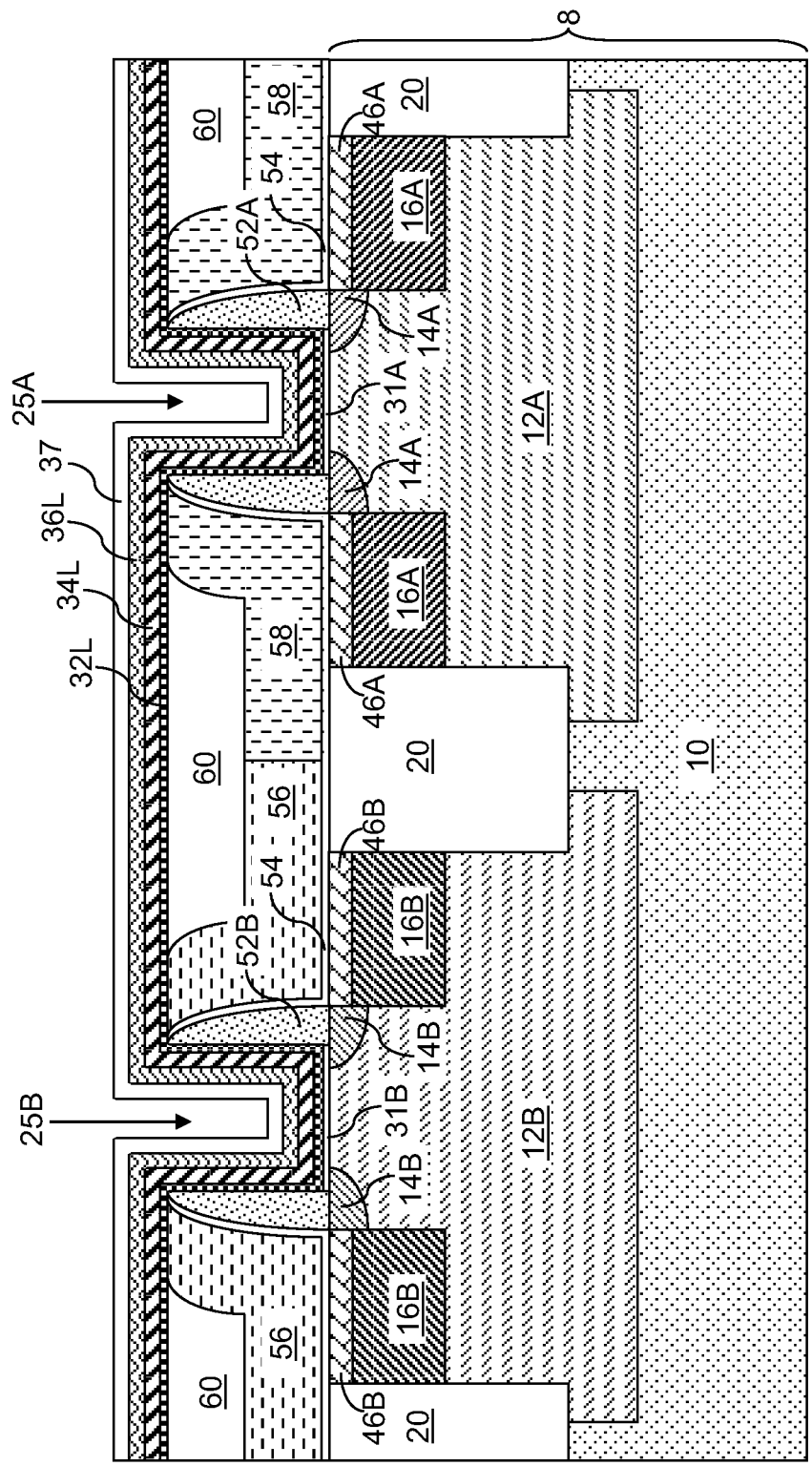
FIG. 10 is a vertical cross-sectional view of a second exemplary semiconductor structure after formation of a stack of a contiguous gate dielectric layer, a first-type work function metal layer, a barrier metal layer, and a dielectric masking layer according to the second embodiment of the present disclosure.

Referring to FIG. 10, a second exemplary semiconductor structure according to the second embodiment of the present disclosure is derived from the first exemplary semiconductor structure of FIG. 2 by forming a stack, from bottom to top, of a contiguous gate dielectric layer 32L, a first-type work function metal layer 34L including a first metal having a first work function, a barrier metal layer 36L, and a dielectric masking layer 37 in the first and second gate cavities (25A, 25B) and on the planar dielectric surface 63 of the planarization dielectric layer 60. The composition can be the same as in the first embodiment for each of the contiguous gate dielectric layer 32L, the first-type work function metal layer 34L, the barrier metal layer 36L, and the dielectric masking layer 37. The thickness can be the same as in the first embodiment for each of the contiguous gate dielectric layer 32L, the first-type work function metal layer 34L, and the dielectric masking layer 37.

In the second embodiment, the barrier metal layer 36L does not need to be thin enough to allow the energy band at the bottom of the barrier metal layer 36L to be affected by the composition of another metal layer to be subsequently deposited. Thus, the thickness of the barrier metal layer 36L can be from 1 nm to 30 nm, and more typically, from 3 nm to 15 nm, although lesser and greater thicknesses can also be employed. In the second embodiment, the material of the dielectric masking layer 37 is selected to enable a subsequent selective etching of the materials of the barrier metal layer 36L and the first-type work function metal layer 34L relative to the material of the dielectric masking layer 37.

As in the first embodiment, the first metal of the first-type work function metal layer 34L is selected to optimize the performance of a transistor to be subsequently formed employing the first source and drain extension regions 14A, the first source and drain regions 16A, and the second conductivity type well 12A.

Figure 11:
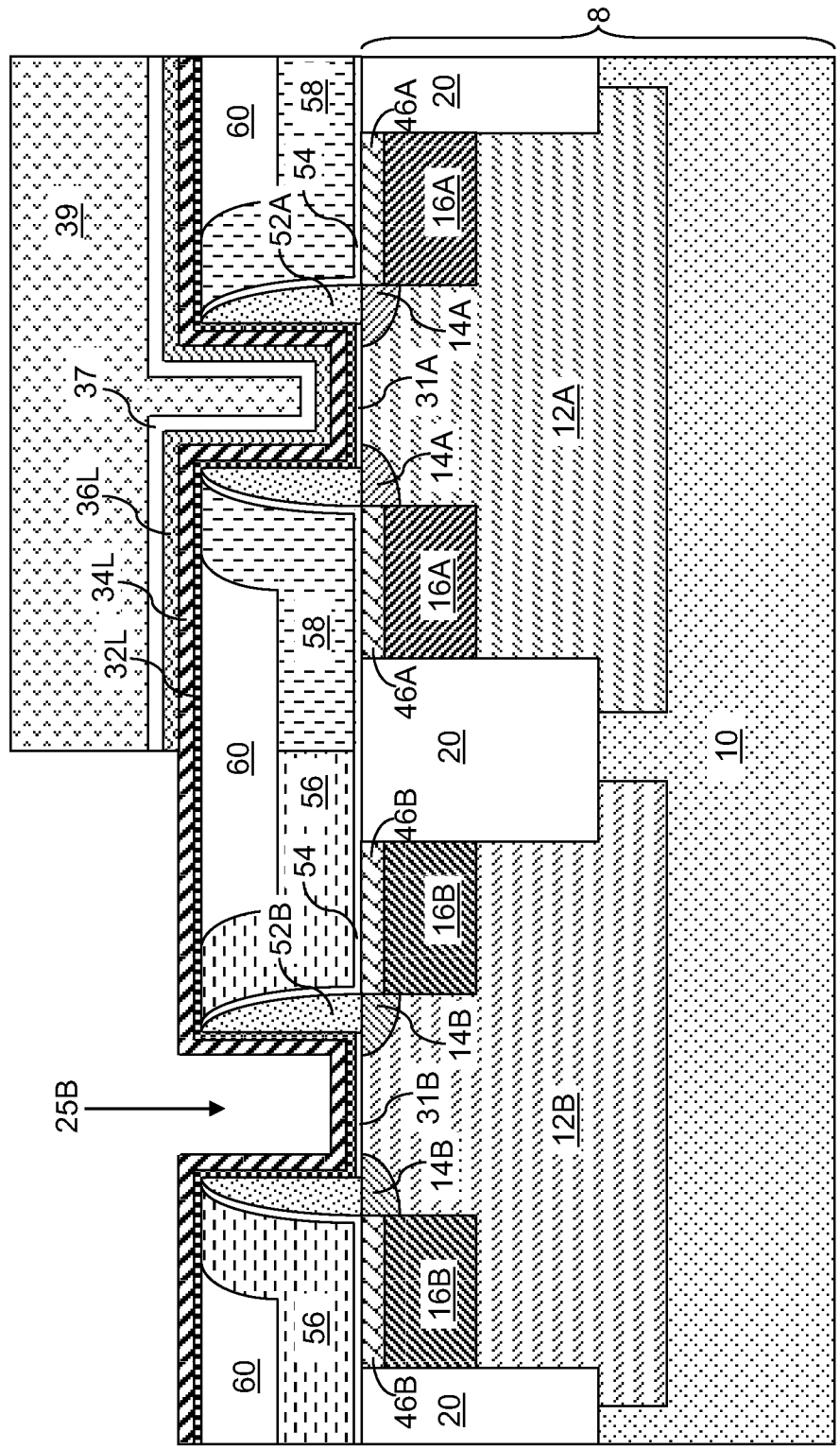
FIG. 11 is a vertical cross-sectional view of the second exemplary semiconductor structure after application of a photoresist and lithographic patterning of the dielectric masking layer and the barrier metal layer according to the second embodiment of the present disclosure.

Referring to FIG. 11, a photoresist 39 is applied over the dielectric masking layer 37 and lithographic patterned so that the photoresist 39 covers the area over the second conductivity type well 12A, while the top surface of the dielectric masking layer 37 is exposed over the first conductivity type well 12B. The pattern in the photoresist 39 is transferred into the dielectric masking layer 37 and optionally into the barrier metal layer 36L by at least one etch. The exposed portion of the dielectric masking layer 37 is removed from within the second gate cavity 25B and a surrounding area thereabout. If the pattern in the photoresist 39 is transferred into the barrier metal layer 36L, the exposed portion of the barrier metal layer 36L is removed from within the second gate cavity 25B.

Figure 12:
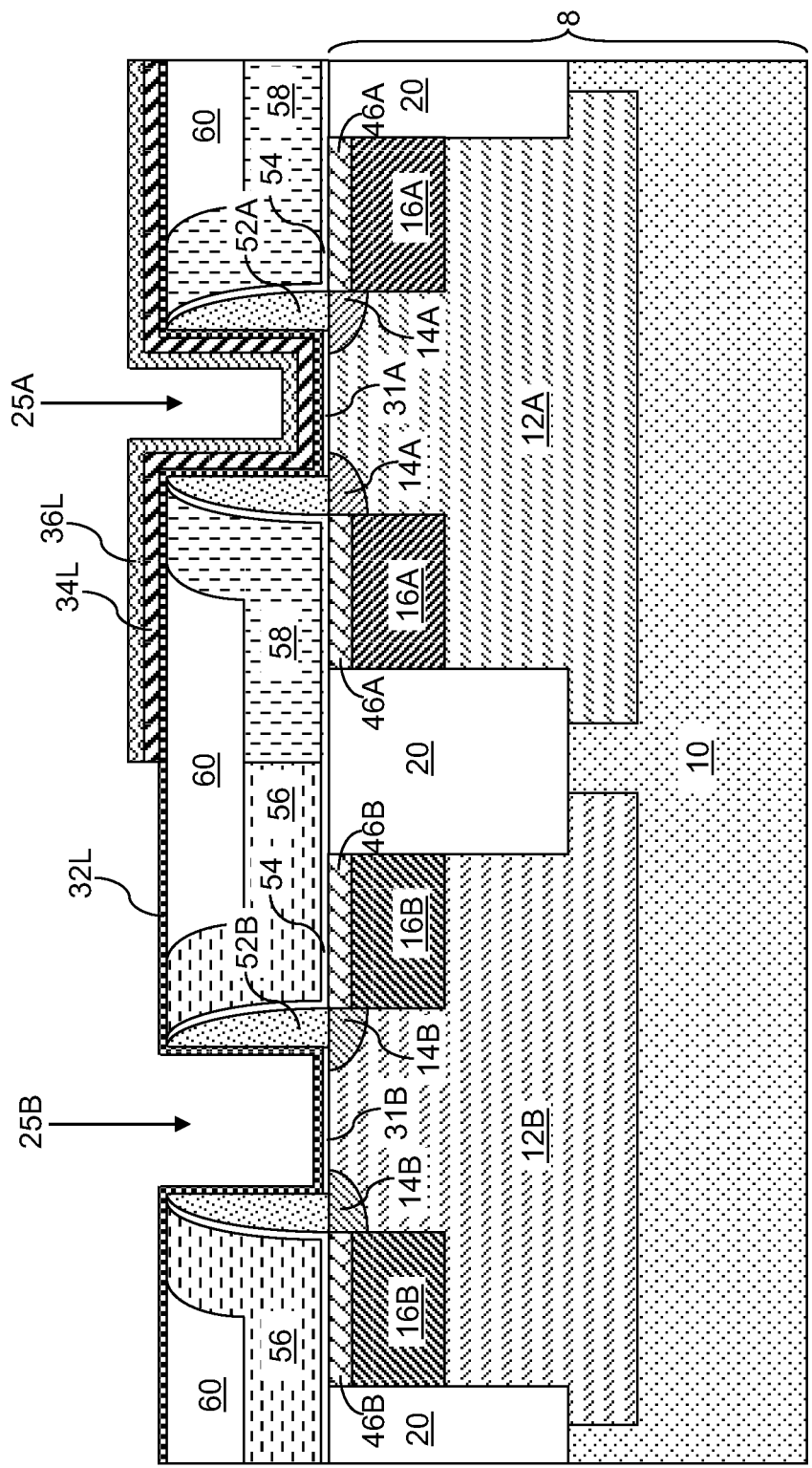
FIG. 12 is a vertical cross-sectional view of the second exemplary semiconductor structure after removal of the photoresist and patterning of the first-type work function metal layer employing the dielectric masking layer as an etch mask according to the second embodiment of the present disclosure.

Referring to FIG. 12, the photoresist 39 is removed, for example, by ashing of wet chemistries. The dielectric masking layer 37 is employed as an etch mask to remove the exposed portion of the barrier metal layer 36L if not previously removed. The remaining portion of the dielectric masking layer 37 is removed selective to the first-type work function metal layer 34L. The portion of the first-type work function metal layer 34L is removed from within the second gate cavity 25B employing the remaining portion of the barrier metal layer 36L as an etch mask during the patterning of the first-type work function metal layer 34L. After the patterning of the first-type work function metal layer 34L, the barrier metal layer 36L and the first-type work function metal layer 34L is present in the first gate cavity 25A, and surfaces of the contiguous gate dielectric layer 32L are exposed within the second gate cavity 25B and regions thereabout.

Figure 13:
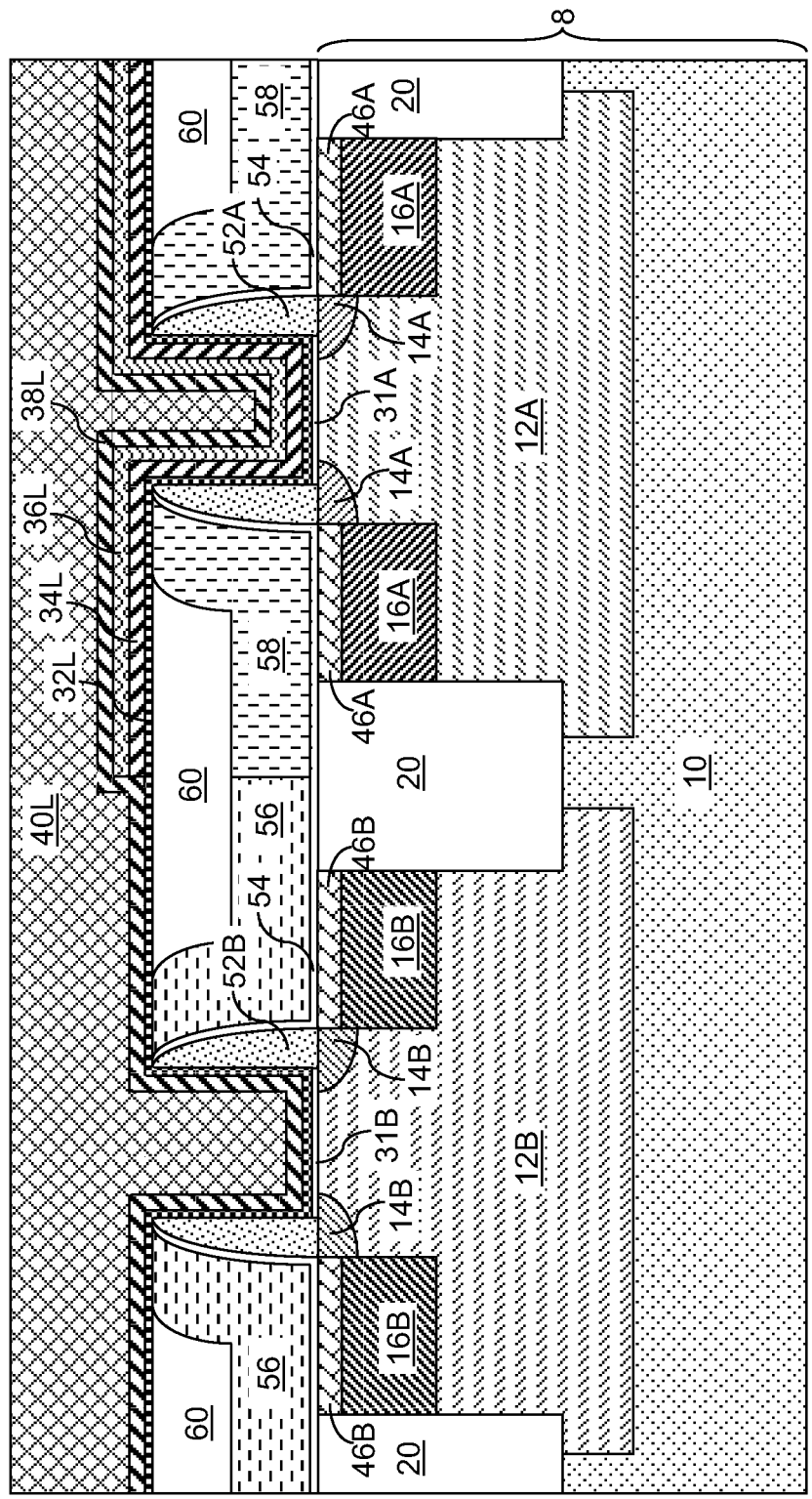
FIG. 13 is a vertical cross-sectional view of the second exemplary semiconductor structure after formation of a second-type work function metal layer and a gate conductor layer according to the second embodiment of the present disclosure.

Referring to FIG. 13, a second-type work function metal layer 38L and a gate conductor layer 40L are deposited on the exposed surfaces of the contiguous gate dielectric layer 32L and the first-type work function metal layer 34L. The second-type work function metal layer 38L includes a second metal having a second work function, which is different from the first work function. The second metal of the second-type work function metal layer 38L is selected to optimize the performance of a transistor to be subsequently formed employing the second source and drain extension regions 14B, the second source and drain regions 16B, and the first conductivity type well 12B. The second-type work function metal layer 38L can have the same composition and thickness as in the first embodiment.

As in the first embodiment, one of the first and second work functions can be closer to the conduction band of the semiconductor material of the first conductivity type well 12B and the second conductivity type well 12A than the valence band of that semiconductor material, and the other of the first and second work functions can be closer to the valence band than to the conduction band of that material. Typically, the work function that is closer to the conduction band than to the valence band of the semiconductor material is employed to enhance the performance of an n-type field effect transistor, and the work function that is closer to the valence band than to the conduction band of the semiconductor material is employed to enhance the performance of a p-type field effect transistor.

In one embodiment, one of the first and second work functions is closer to the conduction band of the semiconductor material of the first conductivity type well 12B and the second conductivity type well 12A than the valence band of that semiconductor material, and the other of the first and second work functions is closer to the valence band than to the conduction band of that material. Typically, the work function that is closer to the conduction band than to the valence band of the semiconductor material is employed to enhance the performance of an n-type field effect transistor, and the work function that is closer to the valence band than to the conduction band of the semiconductor material is employed to enhance the performance of a p-type field effect transistor.

The gate conductor layer 40L is deposited on the second-type work function metal layer 38L, for example, by chemical vapor deposition, physical vapor deposition, or a combination thereof. The first and second gate cavities (25A, 25B) are completely filled by the gate conductor layer 40L. The gate conductor layer 40L includes a conductive material such as a metal or a doped semiconductor material.

Figure 14:
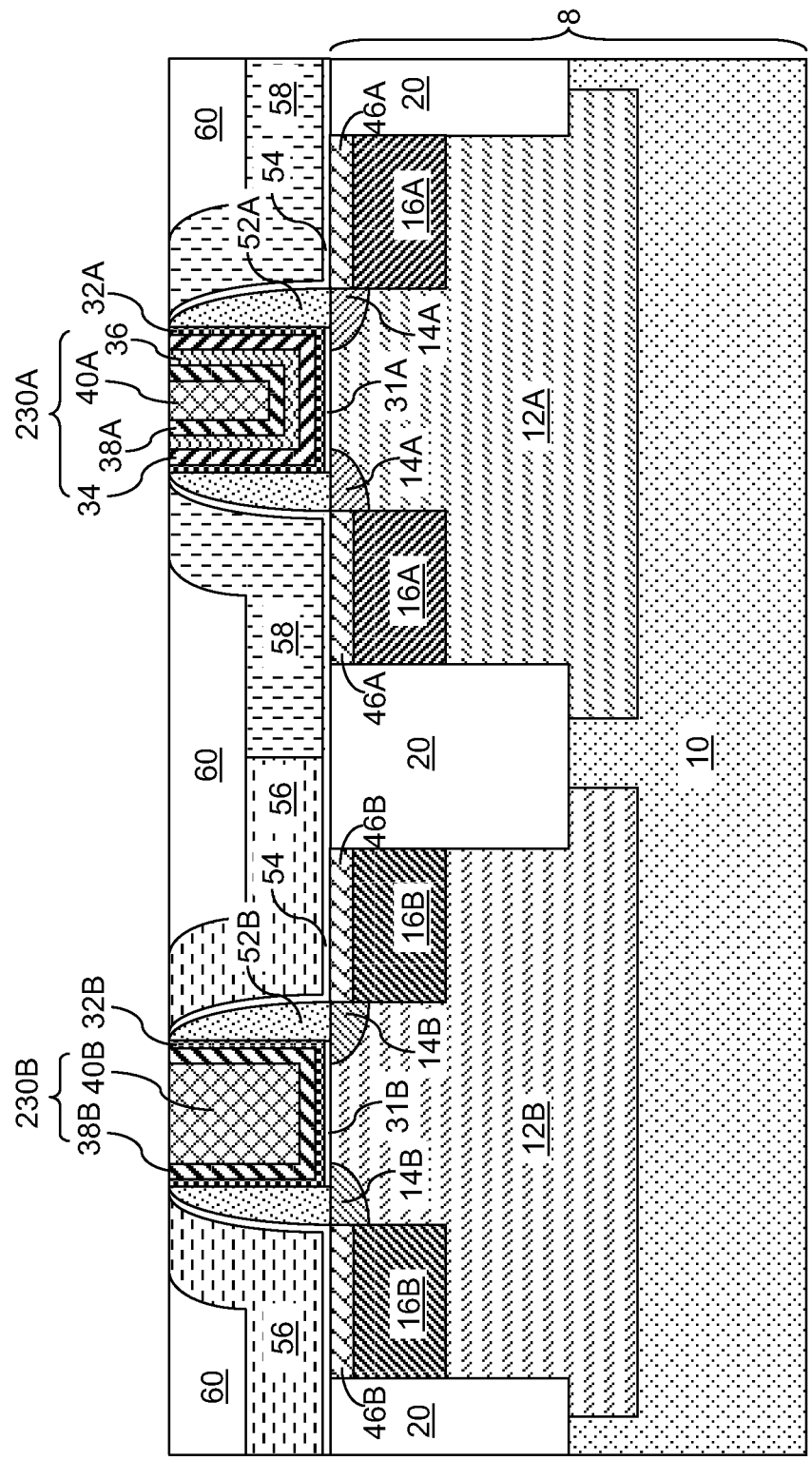
FIG. 14 is a vertical cross-sectional view of the second exemplary semiconductor structure after removal of materials above the planar dielectric surface to form gate structures according to the second embodiment of the present disclosure.

Referring to FIG. 14, portions of the gate conductor layer 40L, the second-type work function metal layer 38L, the barrier metal layer 36L, the first-type work function metal layer 34L, and the portion of the contiguous gate dielectric layer 32L are removed from above the planar dielectric surface 63 of the planarization dielectric layer 63 by employing a planarization process.

A first field effect transistor is formed in the region of the second conductivity type well 12A. The first field effect transistor includes the second conductivity type well 12A, the first source and drain extension regions 14A, the first source and drain regions 16A, a first metal semiconductor alloy portions 46A, the optional first semiconductor-element-containing dielectric layer 31A, a first gate dielectric 32A which is a remaining portion of the contiguous gate dielectric layer 32L, a first-type work function metal portion 34 which is a remaining portion of the first-type work function metal layer 34L, a barrier metal portion 36 which is a remaining portion of the barrier metal layer 36L, a first second-type work function metal portion 38A which is a remaining portion of the second-type work function metal layer 38L, and a first gate conductor portion 40A which is a remaining portion of the gate conductor layer 40L. The first second-type work function metal portion 38A includes the second metal and contacts the barrier metal portion 36.

A second field effect transistor is formed in the region of the first conductivity type well 12B. The second field effect transistor includes the first conductivity type well 12B, the second source and drain extension regions 14B, the second source and drain regions 16A, a second metal semiconductor alloy portions 46B, the optional second semiconductor-element-containing dielectric layer 31B, a second gate dielectric 32B which is a remaining portion of the contiguous gate dielectric layer 32L, a second second-type work function metal portion 38B which is a remaining portion of the second-type work function metal layer 38L, and a second gate conductor portion 40B which is a remaining portion of the gate conductor layer 40L. The second second-type work function metal portion 38B includes the second metal and contacts the second gate dielectric 32B, which has the same thickness as, and includes the same material as, the first gate dielectric 32A.

Each of the first and second gate dielectrics (32A, 32B) includes a horizontal gate dielectric portion and a vertical gate dielectric portion extending upward from peripheral regions of the horizontal gate dielectric portion. In the first field effect transistor, the first-type work function metal portion 34 contacts inner sidewalls of the vertical gate dielectric portion of the first gate dielectric 32A. In the second field effect transistor, the second second-type work function metal portion 38B contacts inner sidewalls of the vertical gate dielectric portion of the second gate dielectric 32B.

The first gate conductor portion 40A contacts an upper surface and inner sidewalls of the first second-type work function metal portion 38A. The second gate conductor portion 40B contacts an upper surface and inner sidewalls of the second second-type work function metal portion 38B. The first and second second-type work function metal portions (38A, 38B) include the same metal.

Figure 15:
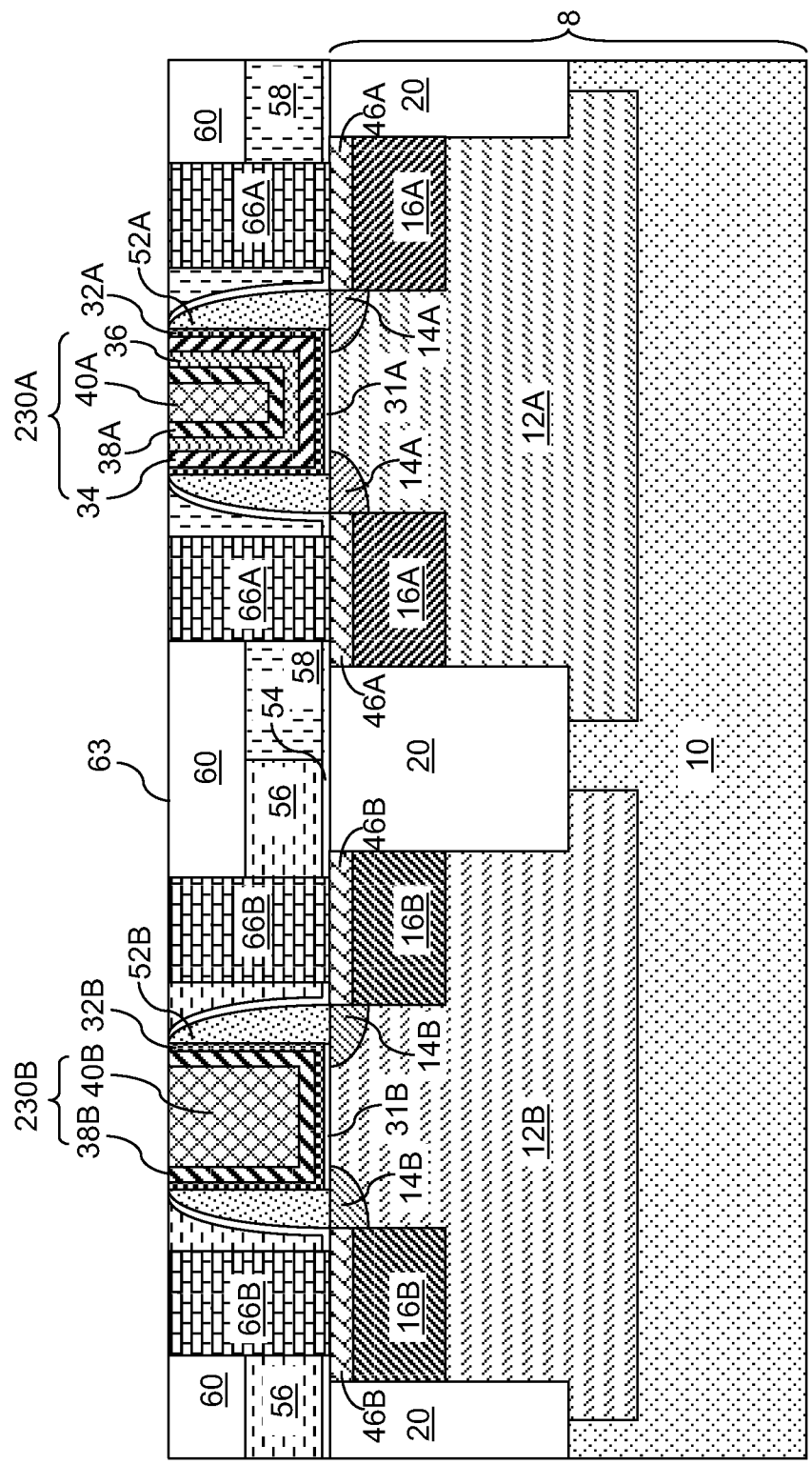
FIG. 15 is a vertical cross-sectional view of the second exemplary semiconductor structure after formation of contact via structures according to the second embodiment of the present disclosure.

Referring to FIG. 15, contact via structures (66A, 66B) can be formed, for example, by formation of contact via cavities by a combination of lithographic patterning and an anisotropic etch followed by deposition of a conductive material and planarization that removes an excess portion of the conductive material from above the planar dielectric surface 63.

Figure 16:
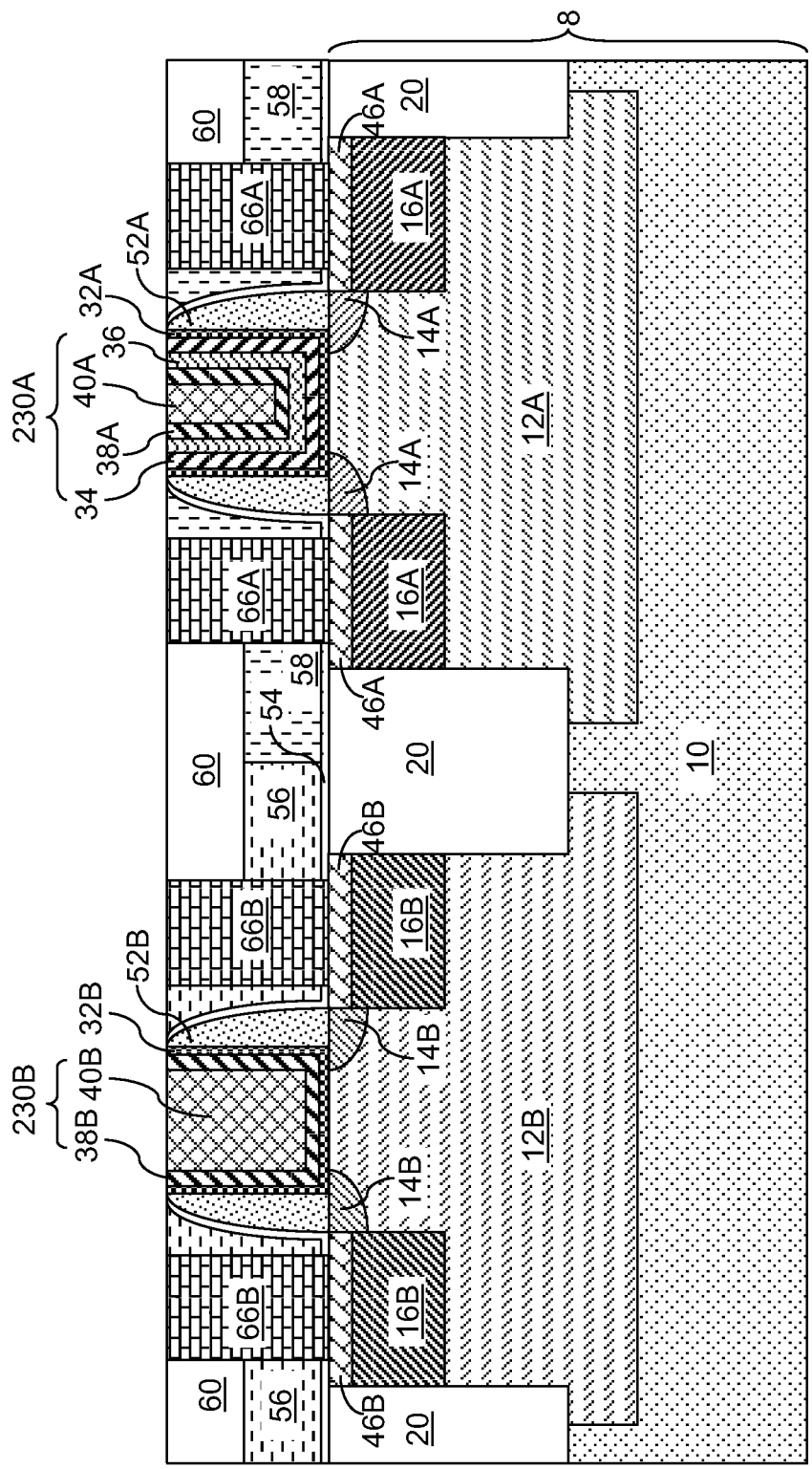
FIG. 16 is a vertical cross-sectional view of a variation of the second exemplary semiconductor structure according to the second embodiment of the present disclosure.

Referring to FIG. 16, a variation of the second exemplary semiconductor structure can be derived from the second exemplary semiconductor structure by omitting the formation of the first semiconductor-element-containing dielectric layer 31A and the second semiconductor-element-containing dielectric layer 31B. In this case, the first gate dielectric 32A contacts the second conductivity type well 12A, and the second gate dielectric 32B contacts the first conductivity type well 12B.

While the disclosure has been described in terms of specific embodiments, it is evident in view of the foregoing description that numerous alternatives, modifications and variations will be apparent to those skilled in the art. Accordingly, the disclosure is intended to encompass all such alternatives, modifications and variations which fall within the scope and spirit of the disclosure and the following claims.

What is claimed is:

1. A semiconductor structure comprising:
a first field effect transistor and a second field effect transistor that are located on a semiconductor substrate comprising a semiconductor material, wherein said first field effect transistor comprises:
a first gate dielectric located over a first portion of said semiconductor substrate;
a first barrier metal portion contacting said first gate dielectric;
a first-type work function metal portion comprising a first metal having a first work function and contacting said first barrier metal portion; and
a first second-type work function metal portion comprising a second metal having a second work function and contacting said first-type work function metal portion, wherein one of said first and second work functions is closer to a conduction band of said semiconductor material of said semiconductor substrate than a valence band of said semiconductor material of said semiconductor substrate, and the other of said first and second work functions is closer to said valence band than to said conduction band,
and wherein said second field effect transistor comprises:
a second gate dielectric located over a second portion of said semiconductor substrate;
a second barrier metal portion contacting said second gate dielectric; and
a second second-type work function metal portion comprising said second metal and contacting said second barrier metal portion;
a first type stress-generating layer located adjacent to said first field effect transistor;
a second type stress-generating layer located adjacent to said second field effect transistor;
a planarization dielectric layer located above portions of said first and second type stress-generating layers;
first contact via structures extending through portions of said planarization dielectric layer and said first type stress-generating layer; and
second contact via structures extending through portions of said planarization dielectric layer and said second type stress-generating layer, wherein said first and said second contact via structures have a topmost surface that is coplanar with topmost surfaces of said planarization dielectric layer, said first and second type stress-generating layers, said first gate dielectric, said first barrier metal portion, said first-type work function metal portion, and said first second-type work function metal portion, said second gate dielectric, said second barrier metal portion, and said second second-type work function metal portion.

2. The semiconductor structure of claim 1, wherein each of said first and second gate dielectrics includes a horizontal gate dielectric portion and a vertical gate dielectric portion extending upward from peripheral regions of said horizontal gate dielectric portion, wherein one of said first and second barrier metal portions contacts inner sidewalls of said vertical gate dielectric portion.

3. The semiconductor structure of claim 1, wherein said first field effect transistor further comprises a first gate conductor portion contacting an upper surface and inner sidewalls of said first second-type work function metal portion, and said second field effect transistor further comprises a second gate conductor portion contacting an upper surface and inner sidewalls of said second second-type work function metal portion.

4. The semiconductor structure of claim 1, wherein one of said first and second field effect transistors is a p-type field effect transistor and the other of said first and second field effect transistors is an n-type field effect transistor, wherein one of said first-type work function metal portion and said second second-type work function metal portion is located in said p-type field effect transistor and has a work functions that is closer to said valence band than said conduction band, and the other of said first-type work function metal portion and said second second-type work function metal portion is located in said n-type field effect transistor and has a work functions that is closer to said conduction band than said valence band.

5. The semiconductor structure of claim 1, wherein said first and second gate dielectrics comprise a same dielectric metal oxide having a dielectric constant greater than 8.0.

6. The semiconductor structure of claim 1, wherein the at least one of the first barrier metal layer and the second barrier metal layer comprises at least one of a mid band gap metal selected from the group consisting of Ag, Mo, Ta, Re, Hg, Fe, Ru, alloys thereof, and conductive compounds thereof.

7. The semiconductor structure of claim 1, wherein the first metal having the first work function comprises a silicon valence band edge metal selected from the group consisting of Pt, Rh, Ir, Ru, Cu, Os, Be, Co, Pd, Te, Cr, Ni, TiN, and alloys thereof.

8. The semiconductor structure of claim 1, wherein the second metal having the second work function comprises a silicon conduction band edge metals such as selected from the group consisting of Hf, Ti, Zr, Cd, La, Tl, Yb, Al, Ce, Eu, Li, Pb, Tb, Bi, In, Lu, Nb, Sm, V, Zr, Ga, Mg, Gd, Y, and TiAl, and alloys thereof.

9. The semiconductor structure of claim 1, wherein at least one of the first gate dielectric and the second gate dielectric is a high-k dielectric selected from the group consisting of $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof.

* * * * *